US011430749B2

(12) United States Patent
Mergens et al.

(10) Patent No.: US 11,430,749 B2
(45) Date of Patent: Aug. 30, 2022

(54) ESD PROTECTION IN AN ELECTRONIC DEVICE

(71) Applicant: Infineon Technologies AG, Neubiberg (DE)

(72) Inventors: Markus Mergens, Kirchseeon (DE); Werner Simbuerger, Haar (DE)

(73) Assignee: Infineon Technologies AG, Neubiberg (DE)

( * ) Notice: Subject to any disclaimer, the term of this patent is extended or adjusted under 35 U.S.C. 154(b) by 202 days.

(21) Appl. No.: 16/662,425

(22) Filed: Oct. 24, 2019

(65) Prior Publication Data
US 2020/0135666 A1   Apr. 30, 2020

Related U.S. Application Data

(60) Provisional application No. 62/753,412, filed on Oct. 31, 2018.

(51) Int. Cl.
| *H01L 23/60* | (2006.01) |
| *H01L 29/66* | (2006.01) |
| *H01L 21/285* | (2006.01) |
| *H01L 23/522* | (2006.01) |

(52) U.S. Cl.
CPC ........ *H01L 23/60* (2013.01); *H01L 21/28518* (2013.01); *H01L 23/522* (2013.01); *H01L 29/66575* (2013.01)

(58) Field of Classification Search
CPC .............. H01L 21/28518; H01L 23/60; H01L 27/0266–0285; H01L 27/0292; H01L 27/0259; H01L 27/0262; H01L 27/0255; H01L 29/1087; H01L 29/665; H01L 29/66507
See application file for complete search history.

(56) References Cited

U.S. PATENT DOCUMENTS

| 6,083,784 A  * | 7/2000 | Hirade ............ H01L 21/823418 257/E21.619 |
| 6,225,166 B1 * | 5/2001 | Hsu .................... H01L 21/28518 257/E21.165 |
| 6,897,536 B2 * | 5/2005 | Nomura .............. H01L 29/7835 257/403 |
| 8,779,462 B2 * | 7/2014 | Schulze ............ H01L 21/26513 257/101 |
| 2004/0256681 A1* | 12/2004 | Irino .................... H01L 27/0266 257/384 |
| 2008/0211028 A1* | 9/2008 | Suzuki ................ H01L 27/0266 257/360 |
| 2011/0233677 A1* | 9/2011 | Yamamoto ........ H01L 29/41758 257/355 |

(Continued)

*Primary Examiner* — Eric A. Ward
(74) *Attorney, Agent, or Firm* — Armis IP Law, LLC

(57) ABSTRACT

According to one configuration, a fabricator produces an electronic device to include: a substrate; a transistor circuit disposed on the substrate; silicide material disposed on first regions of the transistor circuit; and the silicide material absent from second regions of the transistor circuit. Absence of the silicide material over the second regions of the respective of the transistor circuit increases a resistance of one or more parasitic paths (such as one or more parasitic transistors) in the transistor circuit. The increased resistance in the one or more parasitic paths provides better protection of the transistor circuit against electro-static discharge conditions.

24 Claims, 13 Drawing Sheets

(56) References Cited

U.S. PATENT DOCUMENTS

| | | | |
|---|---|---|---|
| 2014/0084380 A1* | 3/2014 | Domanski | H01L 27/0259 257/378 |
| 2015/0137233 A1* | 5/2015 | Xue | H01L 29/66492 257/344 |
| 2017/0104063 A1* | 4/2017 | Zhang | H01L 23/481 |
| 2018/0114801 A1* | 4/2018 | Leipold | H01L 29/0847 |

* cited by examiner

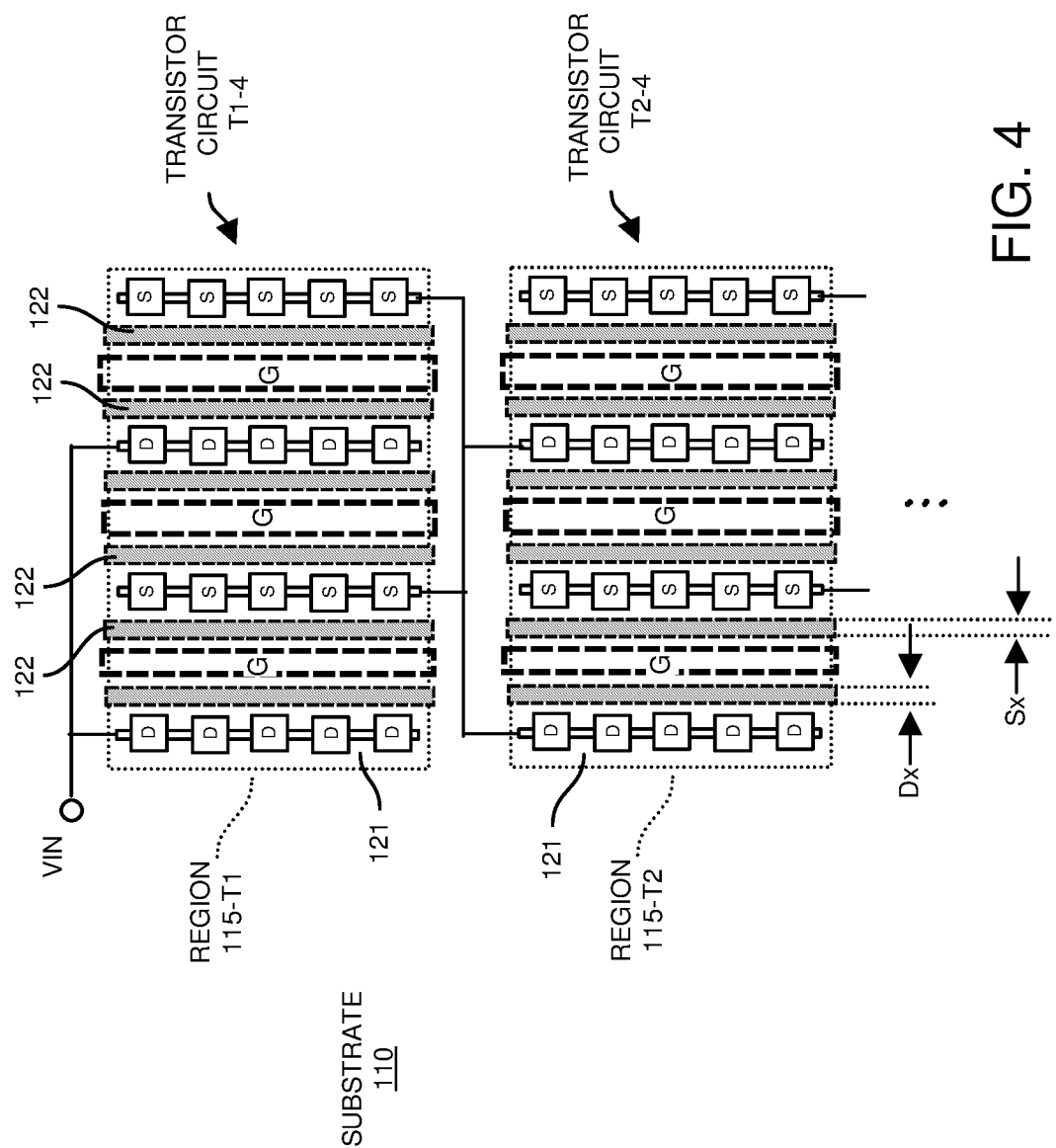

ESD PROTECTION IN AN ELECTRONIC DEVICE

RELATED APPLICATIONS

This application is related to and claims the benefit of earlier filed U.S. Provisional Patent Application Ser. No. 62/753,412 entitled "ESD PROTECTION IN AN ELECTRONIC DEVICE," filed on Oct. 31, 2018, the entire teachings of which are incorporated herein by this reference.

BACKGROUND

Conventional RF-stacks (which means a number of RF-transistors connected in series) comprising fully-silicided NMOS (N-type Metal Oxide Semiconductor) transistors in series (such N=2 to 32 transistors or more) can be applied in a CMOS (Complementary MOS) bulk process technology on an extremely high-resistive substrate (low doped substrate) with a volume resistivity in the range of $\rho\_bulk=100$ to 10 k Ohm centimeter. The MOS bulk corresponds to the substrate.

During normal RF (Radio Frequency) operating conditions of such a device, the low doped substrate is fully depleted by application of a negative substrate DC bias voltage.

The depleted substrate electrically isolates transistors from each other at relatively small distances such that inter-device parasitics (e.g., parasitic NPN between N-junction in an NMOS) remain inactive and therefore do not disturb normal RF operation of the device. This is important since local well-ties within the transistor's bulk as well as N- or P-type guard-rings between transistors (typically used in standard bulk-CMOS for electrical device isolation) may lead to detrimental disturbance of the RF performance and the higher harmonics H2/H3. For ESD (Electro-Static Discharge), this means that a) there is no dedicated bulk diode conducting any ESD currents and b) inter-transistor parasitics can trigger as described below.

During ESD stress of a conventional transistor device, the voltage potential of the substrate is generally floating. As a result, the electrical isolation of transistors and stacks can be relatively poor leading to unwanted device interaction thru the inter-device parasitics. For instance, parasitic NPN triggering between different RF-NMOS within the stack can lead to premature ESD failure. This can occur due to a non-uniform turn-on or triggering of the NPNs initiating also a non-uniform ESD current conduction with the single RF-NMOS. This likely leads to current filamentation and early stack degradation, shortening the useful life of the device.

BRIEF DESCRIPTION

As discussed above, a conventional transistor circuit can include a stack of multiple transistor blocks connected in series. Each transistor block in the stack includes multiple transistors connected in parallel. Additionally, each transistor block (such as multiple field effect transistor circuits connected in parallel) can be placed at a desired distance (such as Dtr) from each other (measured from active region to active region) without any electrical isolation such as bulk-ties or guard-bands-/rings between the transistors.

This disclosure includes the observation that there are two types of critical parasitic transistors present in such stack transistor circuit such as:

a) Parasitic INTRA-transistor parasitic BJT (Bipolar Junction Transistor) path inherent in a single transistor block itself.
b) Parasitic INTER-transistor parasitic BJT path between the junctions of two adjacent transistor blocks in the stack.

One parameter affecting the inter-transistor BJT is the low doping of a substrate. The substrate doping determines also the base doping concentration of inter-transistor parasitic BJT and thus the BJT current gain. This gain can be extremely high due to the low recombination rate of minority carriers in the base favoring the inter-transistor BJT triggering during ESD stress. Triggering of the parasitic transistors can reduce ESD robustness significantly either by degrading itself or by initiating non-uniform current conduction and filamentation within the single transistors.

This disclosure further includes the observation that, to prevent ESD damage to an electronic device, it is desirable to keep these parasitic transistors in the electronic device OFF during ESD conditions or, alternatively, to keep these parasitic BJT functional during turn-on or avalanche breakdown in case of an ESD event. This makes the electronic device more robust and less susceptible to damage.

Embodiments herein include novel application of silicide blocking to surface regions of an electronic device to circuit improve a robustness of a respective circuit against damage from electrostatic discharge.

First Embodiments

More specifically, first embodiments herein include fabricating an apparatus (such as hardware, electronic device, semiconductor chip, integrated circuit, etc.) to include: a substrate; a transistor circuit disposed on the substrate; silicide material disposed on first regions of the transistor circuit; and the silicide material absent from second regions of the transistor circuit. Absence of the silicide material over the second regions provides increased resistance of a parasitic path in the transistor circuit to provide better ESD protection.

In one embodiment, the silicide blocking prevents silicide material from being present in one or more regions of the transistor circuit. For example, to implement silicide blocking, during fabrication, the fabricator can be configured to apply a layer of material on the transistor circuit that ensures that the any silicide (in respective silicide free regions) is etched away in the second regions. Alternatively, embodiments herein can include applying silicide blocking material to the second regions to ensure that silicide material is not present in the second regions.

In accordance with further embodiments, the second regions free of silicide material reside between drain regions and source regions of the transistor circuit. The transistor circuit includes multiple transistors connected in parallel, the multiple transistors on the substrate being non-isolated transistors disposed on the substrate. The increased resistance of the parasitic paths due to absence of the silicide material in the second regions prevents the formation of hot spots by a homogeneous current distribution (ballasting) during exposure of the transistor circuit to an ESD (Electro-Static Discharge) condition.

Note that the substrate can be any suitable resistance. In one embodiment, the substrate is a high ohmic substrate having a volume resistivity of greater than 100 ohm-centimeter. For example, in one non-limiting example embodiment, the substrate has a volume resistance of 0.1 to 10 kilo-ohms-centimeter.

In accordance with further embodiments, the parasitic path includes a parasitic bipolar junction transistor formed in a first transistor block of the transistor circuit. By further way of non-limiting example embodiment, the parasitic path in the first transistor circuit block extends between respective drain regions and source regions.

Note that the first regions over which silicide material is disposed can include any suitable portion of the transistor circuit. For example, in one embodiment, the silicide material is applied over: i) at least a portion respective gate regions of the multiple transistors in the transistor circuit, ii) at least a portion of respective drain regions of the multiple transistors, and/or iii) at least portions of respective source regions of the multiple transistors. In one embodiment, the fabricator produces a first silicide free strip (which is absent silicide) over a portion of the transistor circuit between the drain regions and the gate regions; the fabricator applies a second silicide free strip (which is absent silicide) over a portion of the transistor circuit between the source regions and the gate regions.

In accordance with yet further embodiments, the fabricator fabricates the electronic device to include an area or strip of silicide free region over a perimeter or periphery region of the first transistor circuit. Absence of the silicide material over the perimeter or periphery region of the first transistor circuit increases a resistance of a parasitic path formed by a combination of the first transistor circuit and a second transistor circuit on the substrate adjacent to the first transistor circuit.

In accordance with still further embodiments, the transistor circuit is a first transistor circuit disposed on the substrate; the first transistor circuit comprises first transistors. The fabricator fabricates a second transistor circuit on the substrate, the second transistor circuit being similar to the first transistor circuit. For example, in one embodiment, the second transistor circuit comprises: second transistors, silicide material disposed on first regions of the second transistor circuit, and second regions of the second transistor circuit being free of silicide material. Absence of the silicide material over the second regions of the second transistor circuit providing increased resistance of a parasitic path in the second transistor circuit.

Further embodiments herein include fabricating a circuit path extending between the first transistor circuit and the second transistor circuit; the circuit path connects the first transistor circuit and the second transistor circuit in series. In one embodiment, the fabricator provides a silicide free region over a periphery region of the first transistor circuit; the periphery region is disposed adjacent to the second transistor circuit. Absence of the silicide material over the periphery region of the first transistor circuit increases a resistance of a parasitic transistor path extending between the first transistor circuit and the adjacent second transistor circuit.

In accordance with further embodiments, the parasitic transistor path extending between the first transistor circuit and the adjacent second transistor circuit in the transistor circuit supports flow of current during exposure of the apparatus to an ESD (Electro-Static Discharge) condition. Increased resistance of the parasitic path provides increased ESD protection.

In one embodiment, the second regions of the transistor circuit are respective drain-to-source junction regions (such as between the drain region and source region) of the transistor circuit.

In one embodiment, the transistor circuit includes multiple non-isolated transistors connected in parallel with each other. As previously discussed, in such an embodiment, absence of the silicide material over all or a portion of the respective drain-to-source junction regions (or other selected regions) of the transistor circuit increases a resistance of a parasitic path between drain regions and source regions of the multiple transistors. The parasitic path supports flow of current during exposure of the transistor circuit to an ESD (Electro-Static Discharge) condition.

In accordance with yet further embodiments, a surface region or regions of the transistor circuit on which the silicide material is disposed can include a portion of corresponding drain regions and source regions of the multiple transistors forming the transistor circuit.

Further embodiments herein applying the silicide material over respective gate regions of the transistor circuit; in one embodiment, the respective gate regions reside inside the drain-to-source junction regions. Alternatively, note that embodiments herein can include preventing application of the silicide material in a portion of the respective drain-to-source junction regions such that there is no silicide material over respective gate regions of the transistor circuit.

In a similar manner as previously discussed, further embodiments herein applying the silicide material over respective gate regions of the second transistor circuit. The respective gate regions reside in between drain regions and source regions. Alternatively, embodiments herein include preventing application of the silicide material in all or a portion of the respective drain-to-source junction regions of the second transistor circuit such that there is no silicide material over respective gate regions of the second transistor circuit.

Further embodiments herein include fabricating a circuit path on the substrate to extend between a first transistor circuit and a second transistor circuit of the electronic device. In one embodiment, the circuit path connects the first transistor circuit and second transistor circuit in series. Note that the substrate can include any number of transistor circuits connected in series.

Second Embodiments

Further embodiments herein include fabricating an electronic device (apparatus, hardware, semiconductor chip, integrated circuit, etc.) to include: a first transistor circuit fabricated on a substrate; a second transistor circuit fabricated on the substrate, the first transistor circuit electrically connected to the second transistor circuit; silicide material disposed on the first transistor circuit and the second transistor circuit; and a silicide free region disposed on a periphery region of the first transistor circuit. Absence of the silicide material over the periphery region provides increased resistance of a parasitic path formed via or extending between a combination of the first transistor circuit and the second transistor circuit in the electronic device.

In accordance with further embodiments, the parasitic path of the apparatus is a parasitic transistor path (such as a bipolar junction transistor path) extending from the first transistor circuit to the second transistor circuit. The parasitic path supports flow of current during exposure of the apparatus to an ESD (Electro-Static Discharge) condition.

In still further embodiments, the silicide material is also disposed on the second transistor circuit; the silicide free region is disposed on a periphery region of the second transistor circuit. Absence of the silicide material over the periphery region of the second transistor circuit providing increased resistance of the parasitic path formed via the combination of the first transistor circuit and the second transistor circuit.

Further embodiments herein including fabricating the first transistor circuit from multiple transistors connected in parallel as well as fabricating the second transistor circuit from multiple transistors connected in parallel. The first transistor circuit is connected in series with the second transistor circuit via a circuit path. In one embodiment, the silicide material resides over an interior surface region (such as inside a respective periphery region) of the first transistor circuit and/or the interior surface region of the second transistor circuit.

In accordance with still further embodiments, the fabricator fabricates a third transistor circuit on the substrate. The second transistor circuit resides in a series path between the first transistor circuit and the third transistor circuit. The silicide free region (i.e., absence of silicide material) disposed on the periphery region of the first transistor circuit provides increased resistance of the parasitic path formed via the combination of the first transistor circuit and the third transistor circuit. The fabricator fabricates a silicide free region on a periphery region of the third transistor circuit. Absence of the silicide material over the periphery region of the third transistor circuit provides increased resistance of the corresponding parasitic path extending between the first transistor circuit and the third transistor circuit.

In accordance with yet further embodiments, the first transistor circuit and the second transistor circuit are part of a sequence of multiple transistor circuits connected in series; a respective spacing between at least two pairs of successive transistor circuits in the sequence is varied to protect the apparatus from damage due to electro-static discharge.

In accordance with another example embodiment, the silicide free region is disposed on the periphery region of the first transistor circuit to encompass an interior region of the first transistor circuit over which the silicide material is disposed; the silicide free region is disposed on the periphery region of the second transistor circuit to encompass an interior region of the second transistor circuit over which the silicide material is disposed.

In accordance with further example embodiments, the fabricator fabricates the second transistor circuit to be adjacent to a first side of the first transistor circuit. The fabricator fabricates a third transistor circuit on the substrate. The third transistor circuit is disposed adjacent to a second side of the first transistor circuit. The fabricator fabricates a silicide free region on a periphery region of the third transistor circuit. Absence of the silicide material over the periphery region of the third transistor circuit providing increased resistance of the parasitic path formed between a combination of the first transistor circuit and the third transistor circuit.

These and other more specific embodiments are disclosed in more detail below.

Note that any of the resources as discussed herein can include one or more computerized devices, fabrication machines, fabrication equipment, fabrication resources, mobile communication devices, servers, base stations, wireless communication equipment, communication management systems, controllers, workstations, user equipment, handheld or laptop computers, or the like to carry out and/or support any or all of the method operations disclosed herein. In other words, one or more computerized devices or processors can be programmed and/or configured to operate as explained herein to carry out the different embodiments (such as fabrication of electronic devices) as described herein.

Yet other embodiments herein include software programs to perform the steps and operations summarized above and disclosed in detail below. One such embodiment comprises a computer program product including a non-transitory computer-readable storage medium (i.e., any computer readable hardware storage medium) on which software instructions are encoded for subsequent execution. The instructions, when executed in a computerized device (hardware) having a processor, program and/or cause the processor (hardware) to perform the operations disclosed herein. Such arrangements are typically provided as software, code, instructions, and/or other data (e.g., data structures) arranged or encoded on a non-transitory computer readable storage medium such as an optical medium (e.g., CD-ROM), floppy disk, hard disk, memory stick, memory device, etc., or other a medium such as firmware in one or more ROM, RAM, PROM, etc., or as an Application Specific Integrated Circuit (ASIC), etc. The software or firmware or other such configurations can be installed onto a computerized device to cause the computerized device to perform the techniques explained herein.

Accordingly, embodiments herein are directed to a method, system, computer program product, etc., that supports operations as discussed herein.

One embodiment includes a computer readable storage medium and/or system having instructions stored thereon to facilitate fabrication of electronic devices, circuits, etc., as described herein. The instructions support a corresponding method as described herein. More specifically, the instructions, when executed by computer processor hardware, cause the computer processor hardware (such as one or more co-located or disparately processor devices) to: receive a substrate; fabricate a first transistor circuit on the substrate, the transistor circuit including multiple transistors; fabricate a second transistor circuit on the substrate, the transistor circuit including multiple transistors; fabricate a circuit path to couple the first transistor circuit to the second transistor circuit; apply silicide material over first regions of the first transistor circuit; prevent silicide material from being present over second regions of the first transistor circuit, absence of the silicide material over the second regions of the first transistor circuit providing increased resistance of a parasitic path in the first transistor circuit; apply silicide material over first regions of the second transistor circuit; prevent silicide material from being present in second regions of the second transistor circuit to prevent contact of the silicide material over the second regions of the second transistor circuit, absence of the silicide material over the second regions of the second transistor circuit providing increased resistance of a parasitic path in the second transistor circuit.

Another embodiment includes a computer readable storage medium and/or system having instructions stored thereon to facilitate fabrication of electronic devices, circuits, etc. The instructions support a corresponding method as described herein. More specifically, the instructions, when executed by computer processor hardware, cause the computer processor hardware (such as one or more co-located or disparately processor devices) to: receive a substrate; fabricate a first transistor circuit on the substrate; fabricate a second transistor circuit on the substrate; apply silicide material on the first transistor circuit and the second transistor circuit; prevent silicide material from being present over a periphery region of the first transistor circuit, absence of the silicide material over the periphery region of the first transistor circuit providing increased resistance of a parasitic path formed via a combination of (or between) the first transistor circuit and the second transistor circuit;

prevent silicide material from being present over a periphery region of the second transistor circuit, absence of the silicide material over the periphery region of the second transistor circuit providing increased resistance of the parasitic path formed via the combination of the first transistor circuit and the second transistor circuit.

Note that the ordering of the steps above has been added for clarity sake. Note that any of the processing steps as discussed herein can be performed in any suitable order.

Other embodiments of the present disclosure include software programs and/or respective hardware to perform any of the method embodiment steps and operations (such as fabrication) summarized above and disclosed in detail below.

It is to be understood that the system, method, apparatus, instructions on computer readable storage media, etc., as discussed herein also can be embodied strictly as a software program, firmware, as a hybrid of software, hardware and/or firmware, or as hardware alone such as within a processor (hardware or software), or within an operating system or a within a software application.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of embodiments herein (BRIEF DESCRIPTION OF EMBODIMENTS) purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section (which is a summary of embodiments) and corresponding figures of the present disclosure as further discussed below.

BRIEF DESCRIPTION OF THE DRAWINGS

FIG. 4 is an example diagram illustrating a top view configuration of a transistor circuit according to embodiments herein.

Figure 1A:
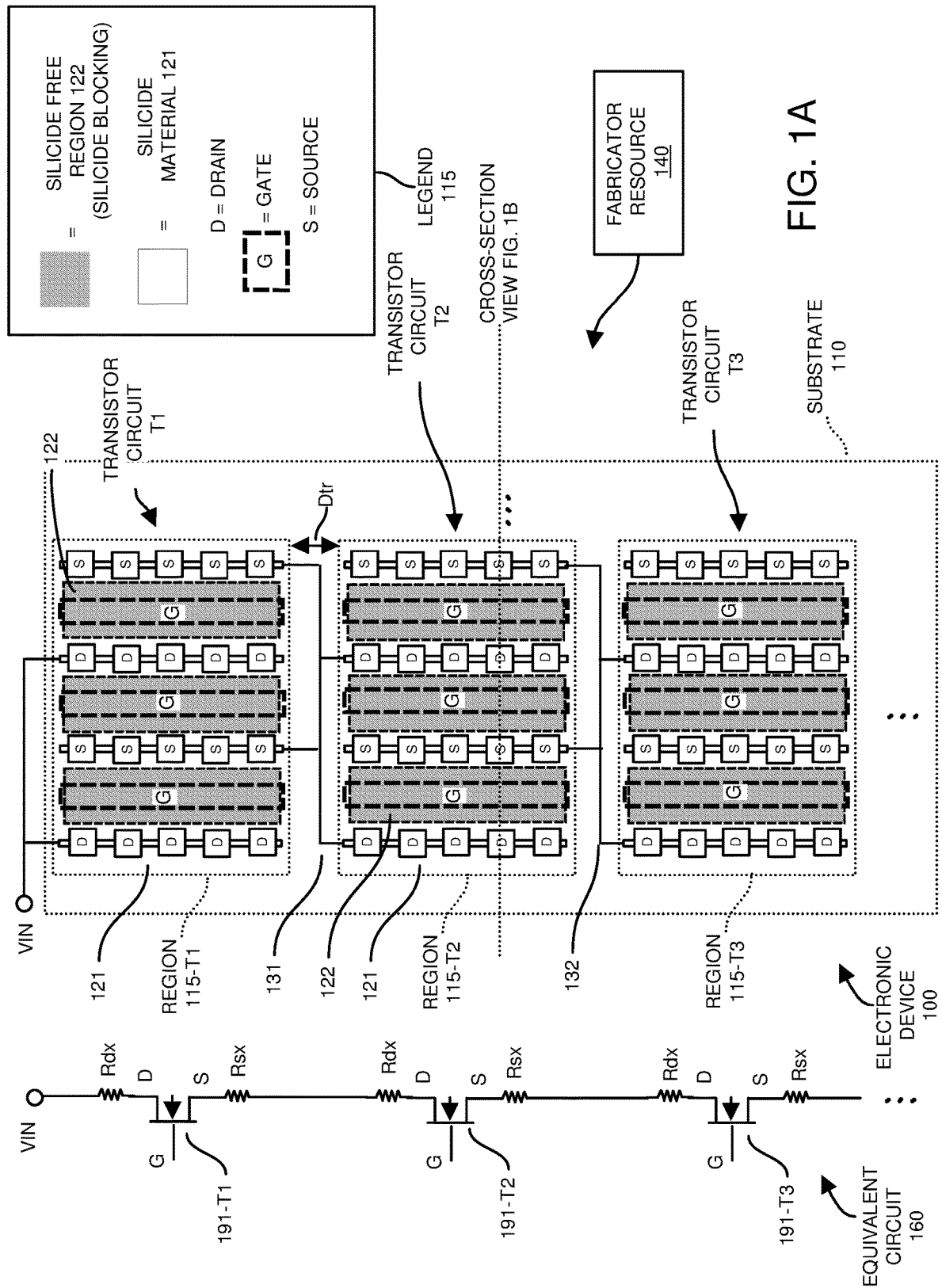
FIG. 1A is an example diagram illustrating a top view configuration of a transistor circuit according to embodiments herein.

The foregoing and other objects, features, and advantages of embodiments herein will be apparent from the following more particular description herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

According to one configuration, a fabricator produces an electronic device to include: a substrate; a transistor circuit disposed on the substrate; silicide material disposed on first regions of the transistor circuit. Via silicide blocking, the fabricator prevents the silicide material from being present over second regions of the transistor circuit. Absence of the silicide material over the second regions of the respective transistor circuit increases a resistance of one or more parasitic paths (such as one or more parasitic transistors) in the electronic device. The increased resistance in the one or more parasitic paths, such as due to strategic placement of silicide material and/or preventing silicide material from being disposed or present on certain surface portions of the electronic device, provides better protection of the electronic device and corresponding transistor circuits against electrostatic discharge conditions.

Now, more specifically, FIG. 1A is an example diagram illustrating a top view configuration of a transistor circuit according to embodiments herein.

As shown in FIG. 1A, fabricator resource 140 (such as a manufacturing facility and corresponding fabrication equipment) is operable to fabricate electronic device 100 (hardware such as a semiconductor chip, integrated circuit, transistor circuit, etc.).

In this example embodiment, electronic device 100 includes: a substrate 110 and one or more transistor circuits T1, T2, T3, etc., disposed on the substrate 110. In one embodiment, the transistor circuits T1, T2, T3, etc., of electronic device 100 (such as RF MOS transistor stack) are connected in series. In one embodiment, the electronic device 100 is an RF device operable at switching frequencies >20 kHz or switching frequencies >1 MHz.

In accordance with further example embodiments, the substrate 110 is a low-doped region (P or N doped depending on the embodiment) and is therefore a highly resistive substrate. For example, in one embodiment, the substrate 110 has any suitable resistance such as a resistance of 1 to 10 kilo-ohms-centimeter, although the substrate 110 can be configured to have any suitable resistance. In accordance with further embodiments, the substrate 110 is a high ohmic substrate having a volume resistivity of greater than 100 ohm-centimeter.

Circuit 160 (on left side) in FIG. 1A illustrates an equivalent circuit diagram of the transistor circuits T1, T2, T3, etc., in the electronic device 100.

Transistor 191-T1 and corresponding resistors Rdx and Rsx of equivalent circuit 160 represent transistor circuit T1 of electronic device 100; transistor circuit 191-T2 and corresponding resistors Rdx and Rsx represent transistor circuit T2 of electronic device 100; transistor circuit 191-T3 and corresponding resistors Rdx and Rsx represent transistor circuit T3 of electronic device 100; and so on. Settings of resistances Rdx and Rsx associated with parasitic paths are controlled via silicide block (silicide free regions 122) as further discussed below.

Note that each of the transistor circuits T1, T2, T3, etc., on substrate 110 includes multiple individual transistors connected in parallel to form a transistor circuit. For example, as shown, transistor circuit T1 includes multiple strings of individual transistors connected in parallel; transistor circuit T2 includes multiple transistors connected in parallel; and so on.

In one embodiment, electronic device 100 includes connectivity between transistor circuits. For example, as shown, the columns of drain nodes in transistor circuit T1 are connected to voltage Vin; via circuit path 131, columns of corresponding source nodes in transistor circuit T1 are electrically coupled to the columns of drain nodes in transistor circuit T2; via circuit path 132, columns of source nodes in transistor circuit T2 are connected to columns of drain nodes in transistor circuit T3; and so on.

Figure 2:
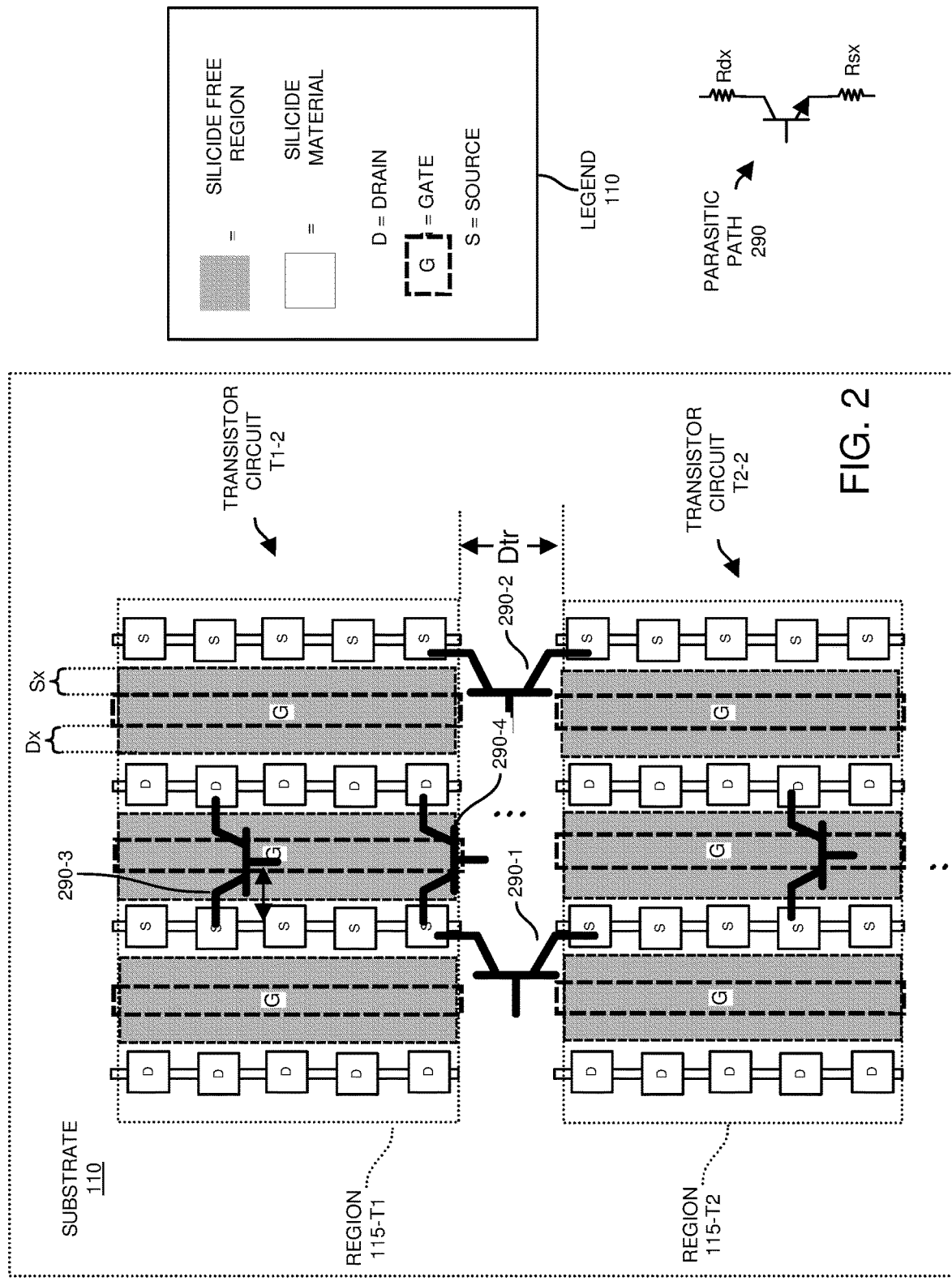
FIG. 2 is an example diagram illustrating parasitic effects in a transistor circuit according to embodiments herein.

As further shown in FIG. 2, the electronic device 100 in FIG. 1A includes undesirable parasitic paths.

More specifically, FIG. 2 is an example diagram illustrating parasitic effects in a transistor circuit according to embodiments herein.

In this example embodiment, intra-transistor parasitic paths such as transistor 290-3, 290-4, etc., within a transistor circuit such as between drain regions and source regions of transistor circuit T1 represent internal (or intra) parasitic paths.

Inter-transistor parasitic paths such as transistor 290-1, 290-2, etc., represent parasitic paths between multiple transistor circuits on the substrate 110 such as between transistor circuit 195-T1 and one or more other transistor circuits on the substrate 110.

As previously discussed, embodiments herein include providing more robust protection of a respective electronic device 100 and corresponding transistor circuits via novel application of silicide material 121 to the transistor circuits T1, T2, T3, etc. Relevant silicide-block design parameters include Dx, Sx, and Dtr. Value Dtr indicates a spacing (distance) between transistor circuit T1-2 and T2-2.

In this example embodiment of FIG. 2, absence of the silicide material 121 over shaded regions (such as respective drain-to-source junction regions, gate regions, etc.) of each transistor circuit increases a resistance (such as Rdx and/or Rsx in the equivalent circuit 160) of a parasitic path between drain regions and source regions of each respective transistor circuit. The increased resistance provides better protection against ESD events.

More specifically, note that distance Dx (such as a distance associated with a silicide free region 122 extending between a respective gate region and drain region) controls a value of Rdx in the equivalent circuit 160; distance Sx (such as a distance associated with a silicide free region 122 extending between a respective gate region and source region) controls a value of Rsx in the equivalent circuit 160.

Summary of Design Parameters Trading Off RF Vs ESD Performance

Application of silicide-blocking (over drain extension) to gate Dx creates resistive drain ballast Rdx value associated with a respective parasitic transistor.

Application of silicide-blocking (over source extension) to gate Sx creates resistive source ballast Rsx value associated with a respective parasitic transistor.

Transistor-transistor distance Dtr influencing base of intra-transistor. More compact stack design by smaller Dtr may be possible by introduction of this type of silicide-block.

Referring again to FIG. 1A, this disclosure includes the observation that the parasitic paths (such as intra parasitic paths) within a single transistor circuit $T_N$ and/or parasitic paths (inter parasitic paths) arising from a combination of multiple transistor circuits T1, T2, etc., are undesirable because they expose the electronic device 100 to possible ESD damage.

To reduce susceptibility to ESD damage, further embodiments herein include implementing silicide blocking with respect to gate and surrounding regions of each transistor circuit. In one embodiment, the respective gate regions reside in between respective vertical drain region and vertical source regions associated with a vertical gate region.

Note that in addition to fabricating transistor circuits, further embodiments herein include fabricating a circuit path (such as made of metal or other suitable material) on the substrate 110 to extend between the first transistor circuit T1 and the second transistor circuit T2. In one embodiment, the circuit path 131 electrically connects the first transistor circuit T1 and second transistor circuit T2 in series. In a similar manner, circuit path 132 provides connectivity between transistor circuit T2 and transistor circuit T3.

Note again that the substrate 110 can include any number of transistor circuits connected in series such as T1, T2, T3, etc., in the electronic device 100.

Thus, in one embodiment, this disclosure is directed to providing better ESD protection such as in RF-MOS transistor stacks including silicide free regions 122 over the drain and source junction of the MOS transistors, respectively. Such measures enhance the ESD robustness of the single transistors, e.g. intra-transistor parasitic bipolar transistor (such as an NPN transistor), within the transistor stack.

As previously discussed, in one embodiment, the substrate 110 is fabricated via use of low-doped substrate technology without electrical transistor isolation. Strategic application of the silicide material 121 and silicide free regions 122 also reduces susceptibility of the inter-transistor bipolar parasitic paths (such as parasitic path 290-1, parasitic path 290-2, etc.).

As a more specific example of fabricating the electronic device 100, as shown in legend 115, the fabricator resource 140 disposes silicide material 121 on first regions (non-shaded regions) of each transistor circuit T1, T2, T3, etc. The fabricator resource 140 applies silicide blocking to prevent silicide material 121 from being present on second regions (shaded regions or silicide free region 122) of the transistor circuits. As previously discussed, absence of silicide material in certain locations of the electronic device 100 provides increased ESD protection.

In one embodiment, the second (shaded) regions (in which the fabricator resource 140 prevents application of the silicide material 121) represent drain-to-source junction regions (such as under gate regions between the drain region and source region or region between drain regions and source regions) of the transistor circuit. A more specific example of the electronic device 100 and cross-section view is shown in FIG. 1B.

Figure 1B:
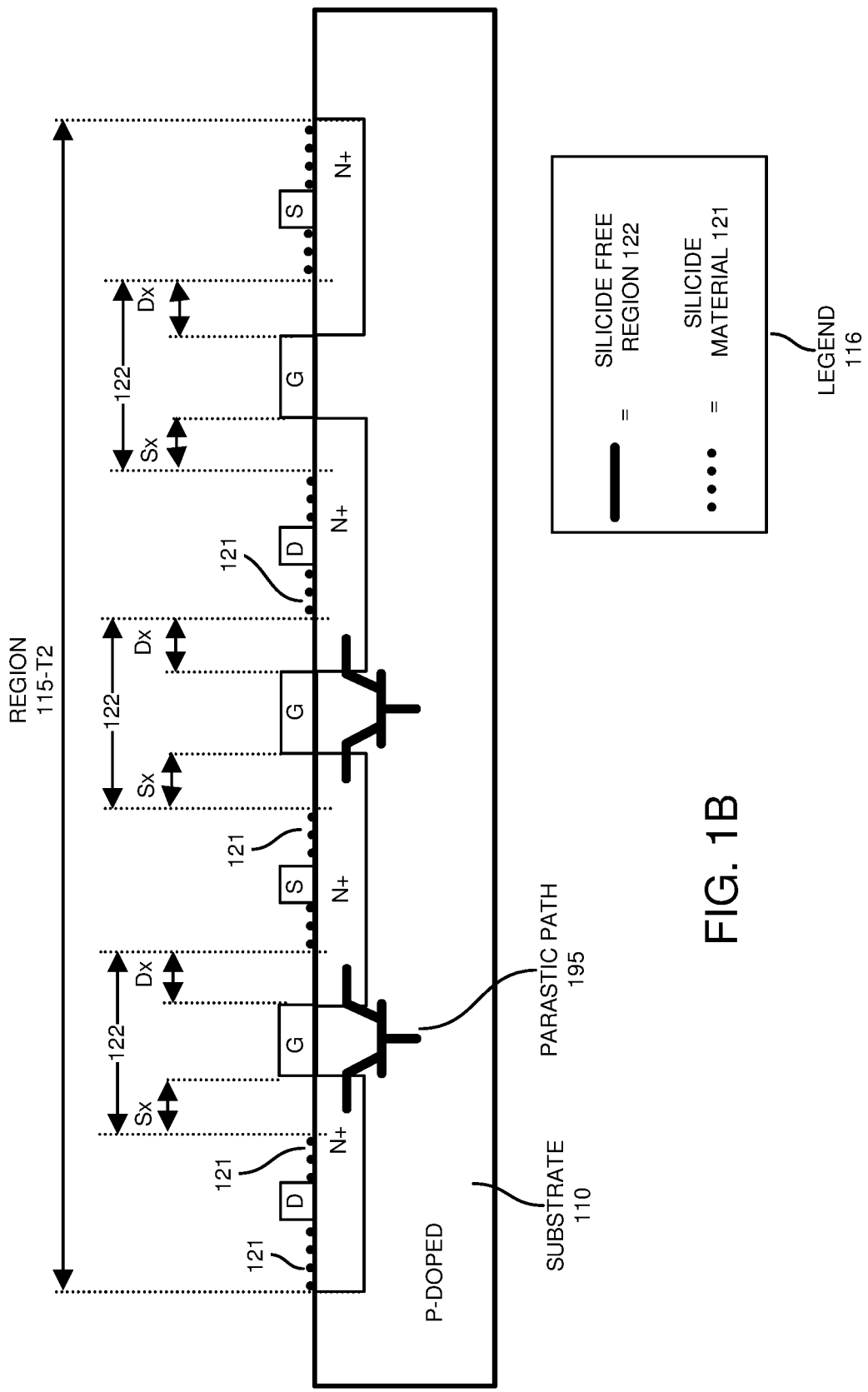
FIG. 1B is an example diagram illustrating a side view configuration of a transistor circuit according to embodiments herein.

As shown, FIG. 1B is an example diagram illustrating a cross sectional view of the electronic device according to embodiments herein.

In this example embodiment, substrate 110 is P-doped. Each drain and source region is N+ doped. Gate regions reside under respective gates labeled G.

Application of silicide blocking in this example embodiment produces silicide free regions 122 over each gate and corresponding region Sx and Dx. As further shown, silicide material 121 resides over a portion of each N+ doped region next to a drain node D. Silicide material 121 resides over a portion of each N+ doped region next to a source node S. Parasitic paths such as parasitic path 195 (such as an NPN transistor) are formed via respective P-doped and N+ doped regions as shown.

As previously discussed, in alternative embodiments, the substrate 110 can be N-doped in which case the source and drain wells are P+ doped. Parasitic paths would PNP transistors.

With further reference to FIG. 1A again, the electronic device 100 (such as an RF-stack of transistor circuits, RF device operable at frequencies >20 kHz or frequencies >1 MHz, etc.) can be configured to include multiple RF-NMOS or RF-PMOS transistor circuits in series, each having symmetrical application of silicide blocking as shown between drain and source regions, which creates junction ballast resistance Rdx and Rsx.

By further way of non-limiting example embodiment, the intra parasitic (transistor) path in the transistor circuit T1 extends between respective vertical sequences of drain regions (labelled D-D-D-D-D) and respective vertical sequences of source regions (labelled S-S-S-S-S) in the multiple transistors forming the respective transistor circuit T1.

In one embodiment, the transistor circuits on substrate 110 are non-isolated transistors. As previously discussed, absence of the silicide material over all or a portion of the respective drain-to-source junction regions of the transistor circuit increases a resistance of a parasitic path between drain regions and source regions of the multiple transistors.

In one embodiment, as previously discussed, the series MOSFET transistor circuits T1, T2, etc., in FIG. 1A do not have any bulk ties while located on a high-resistive substrate 110.

Further, in one embodiment, the transistor circuits are neither isolated to the substrate nor electrically isolated to the other transistors in the stack of electronic device 100, in particular during ESD events. Under normal operation conditions, when the electronic device 100 is in use, a negative voltage bias applied to the substrate 110 depletes the substrate 110 with a substrate and transistor-transistor isolation effect. During ESD conditions, in which the substrate 110 is at a floating voltage potential (with no substrate depletion), not only is the intra-transistor parasitic critical, but also the parasitics between the transistors, e.g. inter-transistor NPNs.

Due to the low sub doping and small recombination rate, these parasitic NPN current gains can reach extremely high values which make it even more likely to trigger and conduct detrimental ESD currents through the transistor circuits of the electronic device 100. The local currents can either directly degrade or imbalance the transistors ESD current conduction resulting in filamentation.

Note that according to further embodiments herein, transistor isolation for ESD can be improved by increasing the transistor to transistor spacing or distance Dtr in a stack. This may result in a larger electronic device 100 and RF parasitic penalty due to increased substrate capacitance.

Thus, in accordance with embodiments herein, the silicide blocking (to produce silicide free regions 122) is applied in such technology to improve the ESD robustness of an RF-stack (such as electronic device 100) with different types of parasitic paths involved in the ESD stress. In one embodiment, as shown, the fabricator resource 140 applies the silicide blocking in a symmetrical way in drain and source regions, respectively, for complying with symmetrical RF operation and stimulus for the negative and positive polarity. Moreover, under ESD stress conditions both polarities can be considered to be equally critical regarding degradation due to the missing bulk diode.

According to further embodiments herein, a higher ESD performance of the intra-transistor (bipolar) parasitic affects (due to parasitic paths within a transistor circuit) can be achieved at the same time, also lowering the detrimental impact of the inter-transistor NPN (or PNP) on the performance. Thus, application of silicide blocking techniques to produce silicide free regions 122 enables a more compact stack design with smaller distances Dtr between the transistor circuits.

As further discussed below, additional embodiments include targeting a direct reduction of the ESD susceptibility of the inter-transistor parasitic NPN by applying a specific silicide-block termination (edge or periphery design) resulting in an overall higher ESD performance.

In general, it is note that larger junctions have a negative impact on the RF performance due to the increased junction capacitance to the substrate as required by any silicide-block junction architecture. In one embodiment, this negative impact is minimized by the negative substrate bias during RF operation resulting in a full junction depletion and minimum substrate capacitance.

Summary of First Embodiments i) RF-NMOS stacks on high-resistive substrate depleted during RF operation while floating under ESD stress conditions
ii) No electrical transistor isolation with well-ties and guard-bands
iii) Silicide-block application of silicide-block in RF-MOS junctions: higher ESD robustness by a strong parasitic intra-transistor bipolar at the same time reducing the detrimental ESD impact of the current injection caused by the parasitic inter-transistor bipolar. This may allows for smaller transistor distances Dtr in the stack and a more compact design. (indirect benefit)
iv) Direct ballasting of inter-transistor bipolar parasitic inherent to neighbored RF-MOS transistors by application of suitable silicide-block termination
v) In one embodiment, transistor circuits in the electronic device 100 are spaced in an equidistant fashion. A compact block design with small distance between the transistors is enabled by silicide-block. As further discussed below, a distance or spacing between transistor circuits can be varied to provide better ESD protection.

In summary, embodiments herein of applying silicide blocking to produce silicide free regions 122 provide advantages over conventional techniques. For example, depending on the configuration, embodiments herein: i) enable HBM (Human Body Model) pass-level for products reaching up to 15 kV-HBM per mm gate width, ii) enable system-level pass of, e.g. 8 kV-GUN, for RF pins (IEC 61000-4-2) not being reached by corresponding standard stacks without silicide blocks, iii) more compact circuit (electronic device 100) height due to smaller transistor spacing enabled by silicide-block intra-transistor or/and intra-transistor design, iv) if ESD is the figure of merit (and not the on-resistance Ron of the stack) silicide-block stacks can be significantly more area efficient compared to standard stacks with less parasitic impact on the RF performance.

Figure 3:
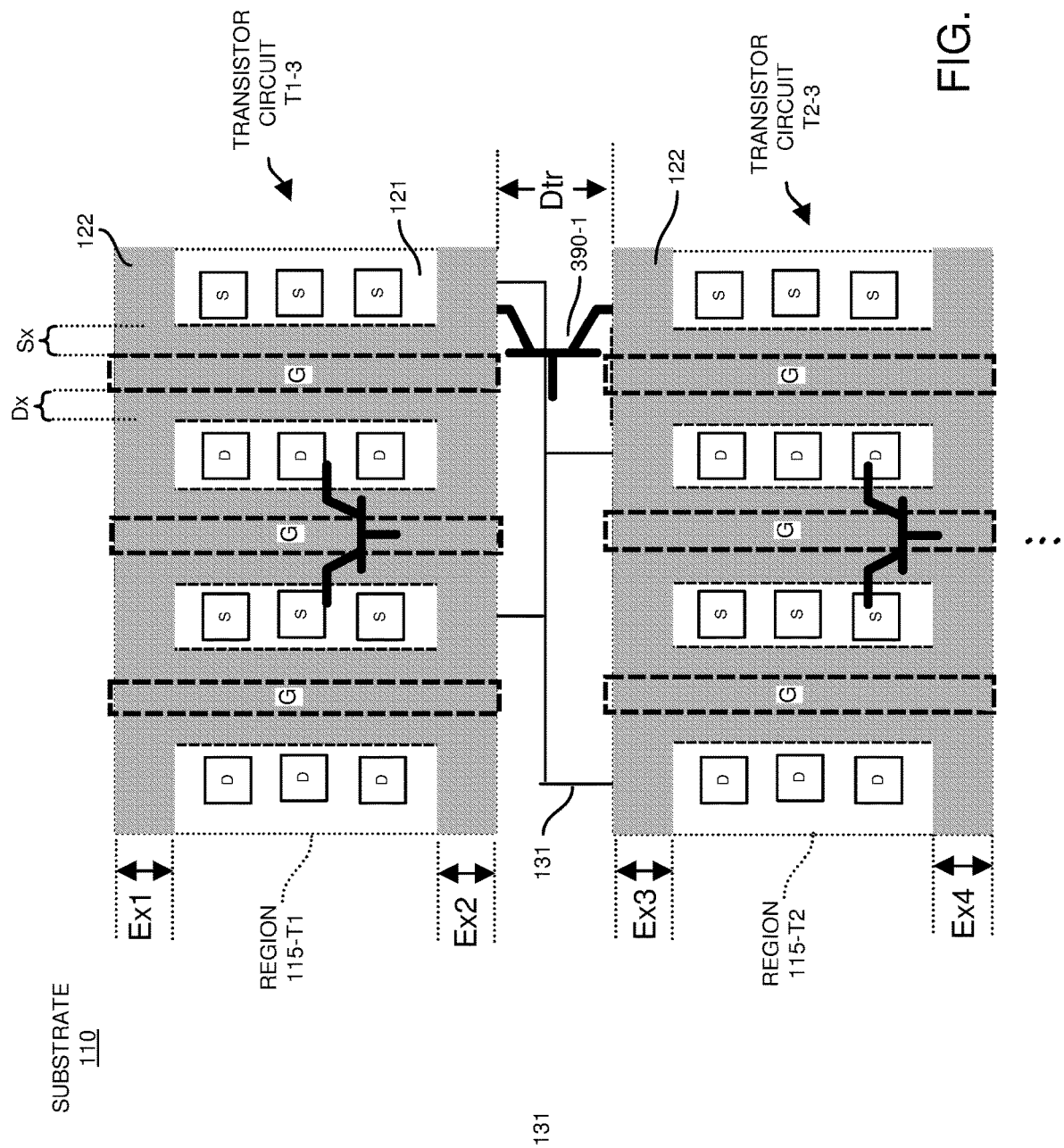
FIG. 3 is an example diagram illustrating a top view configuration of a transistor circuit according to embodiments herein.

FIG. 3 is an example diagram illustrating a top view configuration of a transistor circuit according to embodiments herein.

This example embodiment includes intra-transistor NPN (or PNP) ballasting with symmetrical, single-layer silicide-block including gate, drain and source and inter-transistor NPN (or PNP) ballasting using edge termination with silicide-block without contacts in this region. Silicide-block design parameters include Dx, Sx, Ex, and Dtr.

Design parameters trading off RF vs ESD performance:
Silicide-block drain extension to gate Dx creates resistive drain ballast Rdx
Silicide-block source extension to gate Sx creates resistive source ballast Rsx
Silicide-block edge termination Ex creates resistive ballast for the parasitic inter-transistor NPN of its collector and emitter, respectively
Transistor-transistor distance Dtr influencing base of intra-transistor NPN. Further reduction may be possible due to Ex termination and less sensitive NPN FIG. 3 shows an extension of FIG. 2, directly ballasting the inter-transistor 390-1 having a base length of approximately the RF-NMOS transistor spacing Dtr between the diffusion. The objective of this embodiment is to harden the NPN transistor, resulting in overall higher stack ESD robustness.

In this example embodiment, the fabricator resource 140 additionally fabricates the electronic device 100 to include a strip or region that is free of silicide material (i.e., in regions labeled Ex) over a perimeter or periphery region (such as region Ex1, Ex2) of the first transistor circuit T1-3 as shown in FIG. 3. Absence of the silicide material 121 over the perimeter or periphery region (Ex2) of the first transistor circuit T1-3 increases a resistance of a parasitic path (such as path 390-1) formed by a combination of the first transistor circuit T1-3 and adjacent transistor circuit T2-3 on the substrate 110. Inherent parasitic transistor path 390-1 extends between transistor circuit T1-3 and T2-3.

As further shown, the second transistor circuit T2-3 comprises: second transistors, silicide material 121 disposed on first regions (unshaded regions) of the second transistor circuit T2-3, and second regions (region Ex3) of the second transistor circuit T2-3 are free of silicide material. Absence of the silicide material 121 over the second regions of the second transistor circuit T2-3 provides increased resistance of the parasitic path 390-1 extending between transistor circuit T1-3 and transistor circuit T2-3.

Further embodiments herein include fabricating a circuit path 131 extending between the first transistor circuit T1-3 and the second transistor circuit T2-3. As previously discussed, the circuit path 131 connects the first transistor circuit T1-3 and the second transistor circuit T2-3 in series.

The fabricator resource 140 produces a silicide free strip (region) over a periphery region (region Ex2) of the first transistor circuit T1-3. The periphery region (Ex2) is disposed on a side or edge of the transistor circuit T1-3 adjacent to the second transistor circuit T2-3. Absence of the silicide material 121 (in silicide free regions 122) over the periphery region (Ex2) of the first transistor circuit T1-3 increases a resistance of a parasitic transistor path 390-1 extending between the first transistor circuit T1-3 and the second transistor circuit T2-3. As previously discussed, the parasitic transistor path 390-1 in the electronic device 100 (transistor circuit) supports flow of current during exposure of the apparatus to an ESD (Electro-Static Discharge) condition. The increased resistance in the parasitic path due to the silicide free regions 122 reduces ESD current flows through the parasitic paths during an ESD condition.

FIG. 4 is an example diagram illustrating a top view configuration of a transistor circuit according to embodiments herein.

Note that the first regions (over which the fabricator resource 140 implements silicide blocking to produce silicide free regions 122) can include any suitable portion of the transistor circuit. For example, in one embodiment as shown, silicide blocking is applied in strips between gate and drain regions as well as in strips between gate and source regions. The silicide material 121 is applied over: i) gate regions (labeled G) of the multiple transistors in the transistor circuit T1, ii) drain regions of the multiple transistors, and/or iii) source regions of the multiple transistors.

More specifically, as shown in FIG. 4, the fabricator resource 140 can be configured to apply silicide blocking in strips between drain regions (indicated by sequence D-D-D-D-D) and source regions (indicated by S-S-S-S-S) by preventing application of the silicide material 121 in such regions. Silicide material 121 is disposed over respective gate regions G of the transistor circuit T1-4. Thus, in this example embodiment, as shown, the silicide material 121 is disposed over: i) gate regions (G) of the multiple transistors in the transistor circuit T1-4, ii) drain regions of the multiple transistors, and iii) source regions of the multiple transistors. As previously mentioned, a first strip free of any silicide material is disposed over a portion of the transistor circuit T1-4 between the drain regions and the gate regions of transistor circuit T1-4. A second silicide free strip is disposed over a portion of the transistor circuit T1-4 between the source regions and the gate regions.

Thus, embodiments herein include parasitic inter-transistor NPN ballasting with symmetrical, dual-layer silicide-block over a portion of drain and source regions while excluding silicide material over the gate regions. Important silicide-block design parameters Dx and Sx are indicated. If desired, the fabricator resource 140 can be configured to apply silicide blocking in regions Ex as previously discussed to provide intra-transistor NPN ballasting.

Figure 5A:
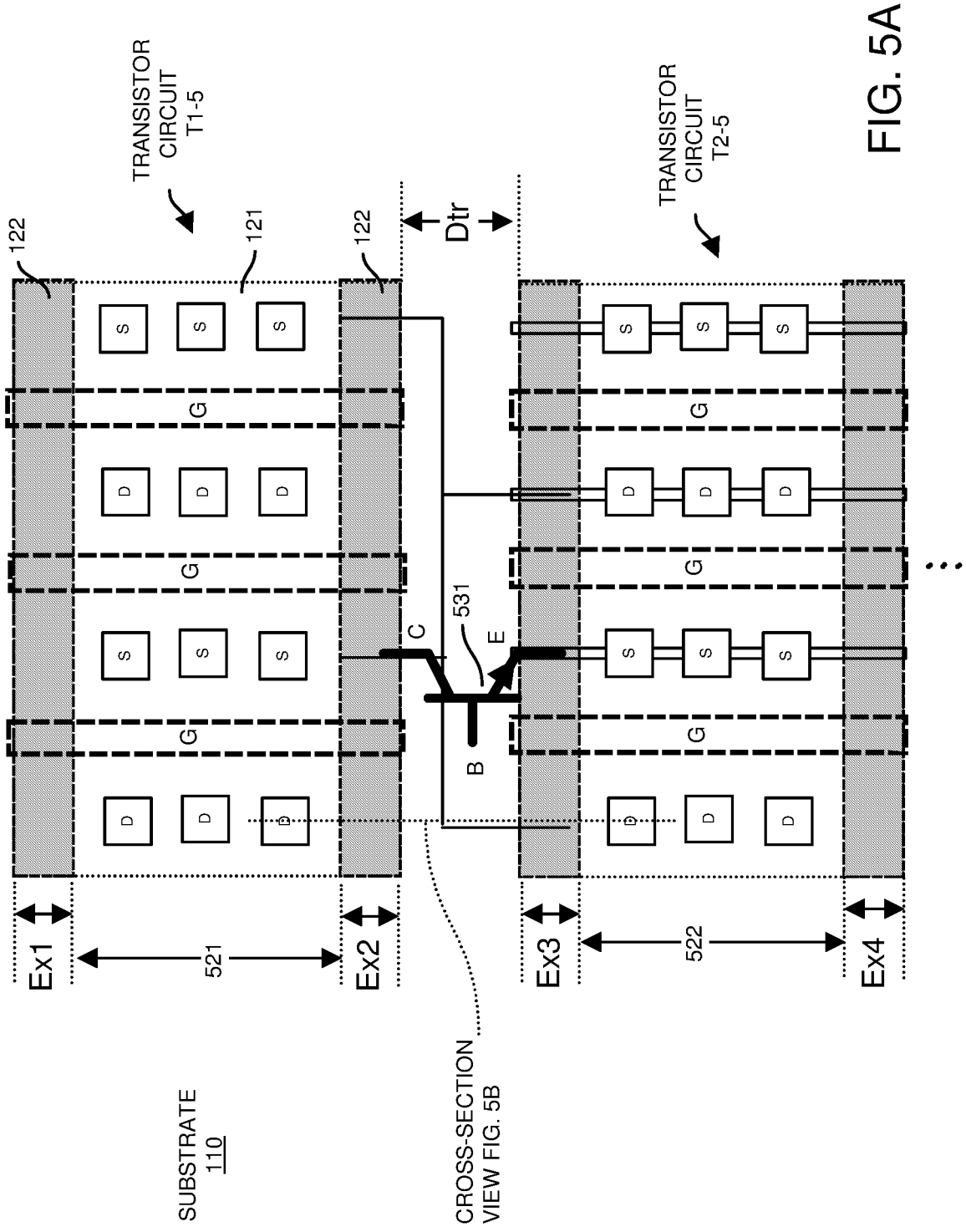
FIG. 5A is an example diagram illustrating a top view configuration of a transistor circuit according to embodiments herein.

Design parameters trading off RF vs ESD performance:
Silicide-block window in drain Dx creates resistive drain ballast Rdx.
Silicide-block window in source Sx creates resistive source ballast Rsx
More compact stack design by smaller Dtr may be possible by introduction of this type of silicide-block FIG. 5A is an example diagram illustrating a top view configuration of a transistor circuit according to embodiments herein.

In this example embodiment, the fabricator resource 140 fabricates first transistor circuit T1-5 on the substrate 110. The fabricator resource 140 fabricates the second transistor circuit T2-5 on the substrate 110.

The first transistor circuit T1-5 is electrically connected in series to the second transistor circuit T2-5.

The fabricator resource 140 applies silicide material 121 on the first transistor circuit T1-5 (such as in region 521) and the second transistor circuit T2-5 (such as region 522). The fabricator resource 140 applies silicide blocking on a periphery region (such as region Ex1 and Ex2) of the first transistor circuit T1-5. Absence of the silicide material 121 over the periphery region (region Ex2) provides increased resistance of a parasitic transistor 531 path formed via a combination of the first transistor circuit T1-5 and the second transistor circuit T2-5.

Accordingly, embodiments herein include parasitic intertransistor NPN ballasting using only edge termination silicide-block (such as in regions Ex1, Ex2, Ex3, Ex4, etc.) for inter-transistor NPN ballasting of a respective collector (C) and emitter (E), respectively (excluding any lateral intratransistor 531 NPN ballasting in drain and source, respectively).

Figure 5B:
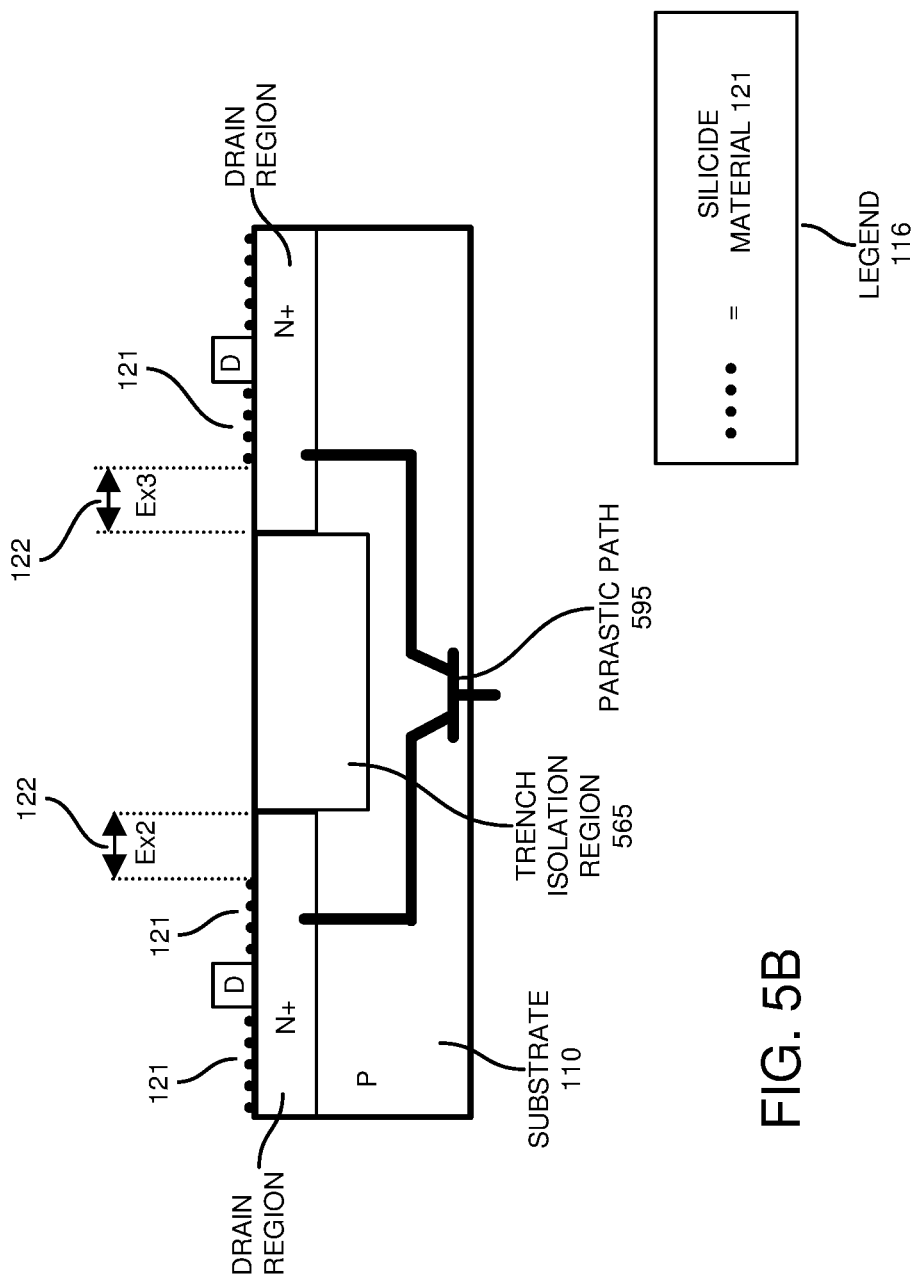
FIG. 5B is an example diagram illustrating a side view configuration of a transistor circuit according to embodiments herein.

FIG. 5B is an example diagram illustrating a side view configuration of a transistor circuit according to embodiments herein.

In this example embodiment, substrate 110 is P-doped. Each drain and source region is N+ doped. The N+ doped drain region is separated from the N+ source region via trench isolation region 565.

In a manner as previously discussed, silicide blocking is applied in Ex regions. Silicide material 121 resides over a portion of each N+ doped region next to a drain node D. Silicide material 121 resides over a portion of each N+ doped region next to a source node S.

Parasitic paths such as parasitic path 595 (such as an NPN transistor) are formed via respective P-doped and N+ doped regions as shown. Absence of silicide material in silicide free edge regions 122 (Ex2 and Ex3) increases a resistance of the parasitic path 590.

Figure 6:
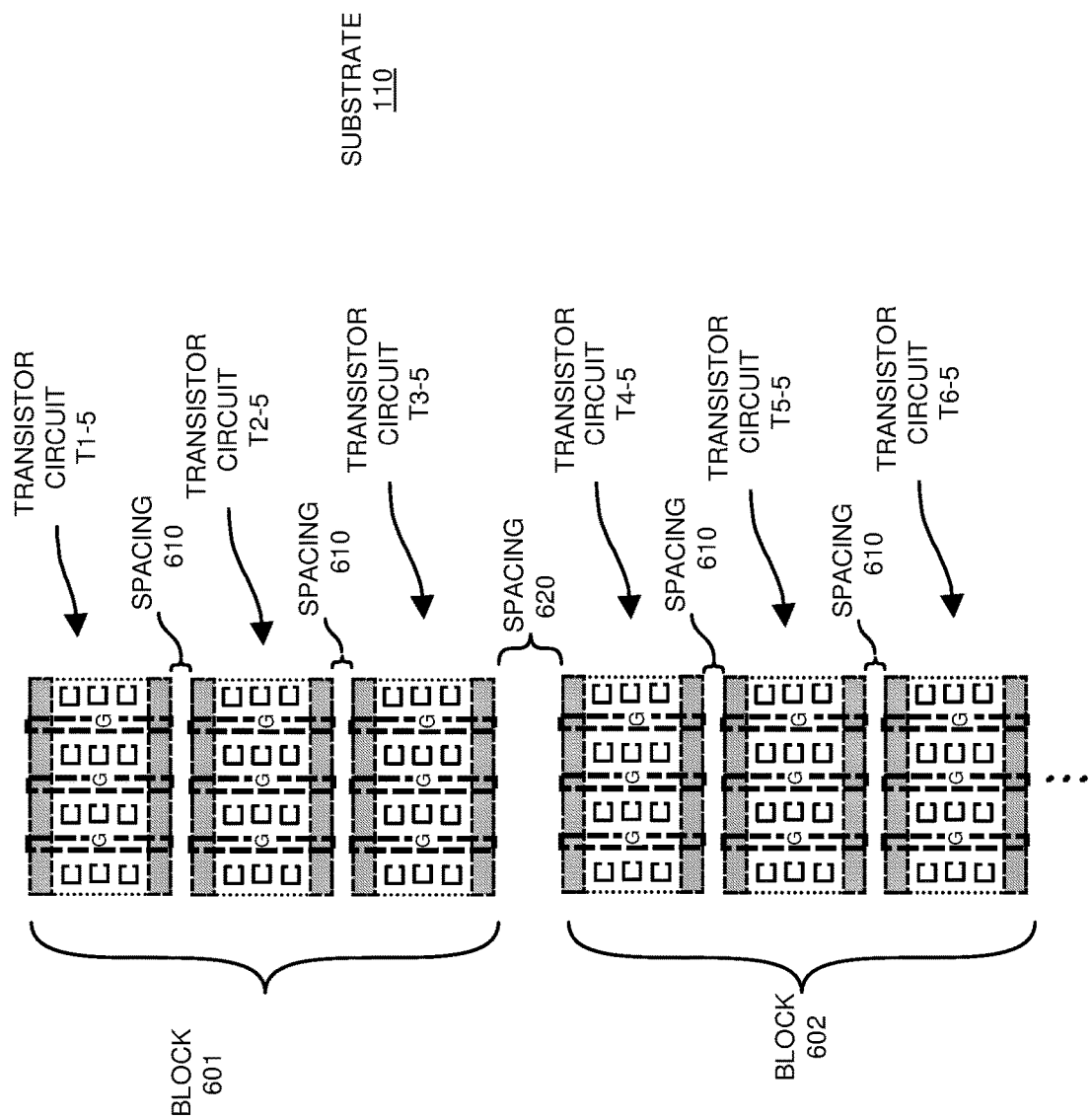
FIG. 6 is an example diagram illustrating a top view configuration of a transistor circuit according to embodiments herein.

FIG. 6 is an example diagram illustrating a top view configuration of a transistor circuit according to embodiments herein.

This example embodiment includes multiple transistor circuits of FIG. 5A in series. For example, block 601 includes transistor circuit T1-5, transistor circuit T2-5, transistor circuit T3-5. Block 602 includes transistor circuit T4-5, transistor circuit T5-5, and transistor circuit T6-5.

The transistor circuits in each block a spaced apart on the substrate 110 by an equal distance (spacing 610). To provide better ESD protection, the fabricator resource 140 varies a respective spacing between at least two pairs of successive transistor circuits in the sequence to protect the first transistor circuit from electro-static discharge.

For example, the fabricator resource 140 spaces the transistor circuit T1-5 apart from transistor circuit T2-5 by a spacing 610; the fabricator resource 140 spaces the transistor circuit T2-5 apart from transistor circuit T3-5 by spacing 610. The fabricator resource 140 spaces the transistor circuit T3-5 apart from transistor circuit T4-5 by a spacing 620; where spacing 620 is substantially larger than the spacing 610.

Thus, instead of using equidistant RF-NMOS in the stack, FIG. 6 shows a block architecture (here 3 blocks) where the transistor distance within the block (e.g. with 4 series transistors) is relatively small or even minimum. Due to the implementation of the silicide blocking as described above, the blocks are better protected against ESD conditions.

This disclosure includes the observation that transistor parasitic paths can conduct harmful ESD currents between transistors over larger distances in the stack due to the high ESD voltage built-up across the stacked RF-NMOS (cf. red NPN above) while adjacent transistors are even safe despite of the short distance due to the relatively small ESD voltage across parasitic. To avoid such a long distance parasitic interaction between transistors by suppressing NPN triggering, blocks can be spaced further apart in a larger distance (such as Dtr,b or spacing 620) than the transistor circuits within a respective block (such as spacing 610).

Thus, in one embodiment, these RF-stack transistor circuits can be spaced apart by different transistor distances instead of the typical equidistance transistor spacing.

Figure 7:
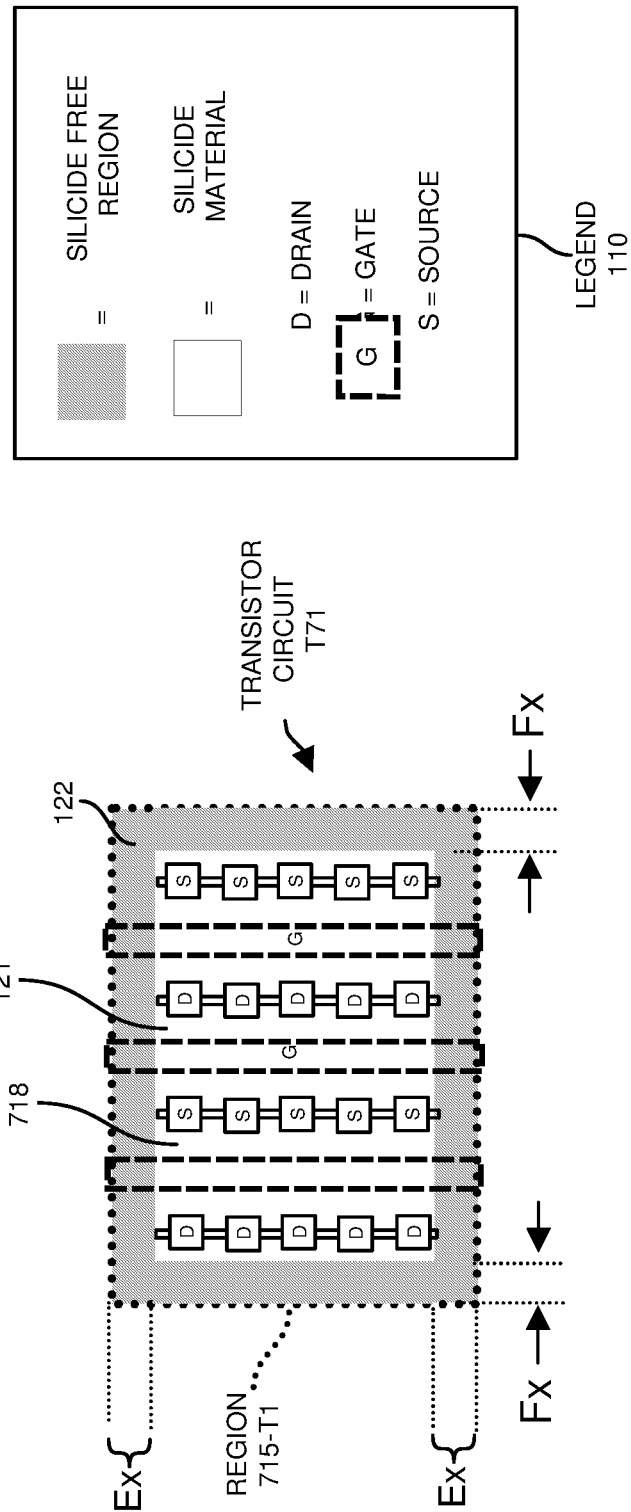
FIG. 7 is an example diagram illustrating a top view configuration of a transistor circuit according to embodiments herein.

FIG. 7 is an example diagram illustrating a top view configuration of a transistor circuit according to embodiments herein.

As shown in this example embodiment, the fabricator resource 140 fabricates transistor circuit T71 on the substrate 110. The fabricator resource 140 applies silicide blocking to create silicide free regions 122 in a periphery region of the transistor circuit T71. The fabricator resource 140 applies silicide material on the interior region 718 of the transistor circuit T71. As discussed further below, application of the silicide blocking and, thus, absence of the silicide material 121 over the periphery region (Ex and Fx) provides increased resistance of a parasitic path formed via a combination of the transistor circuit T71 and another transistor circuit on the substrate 110.

Figure 8:
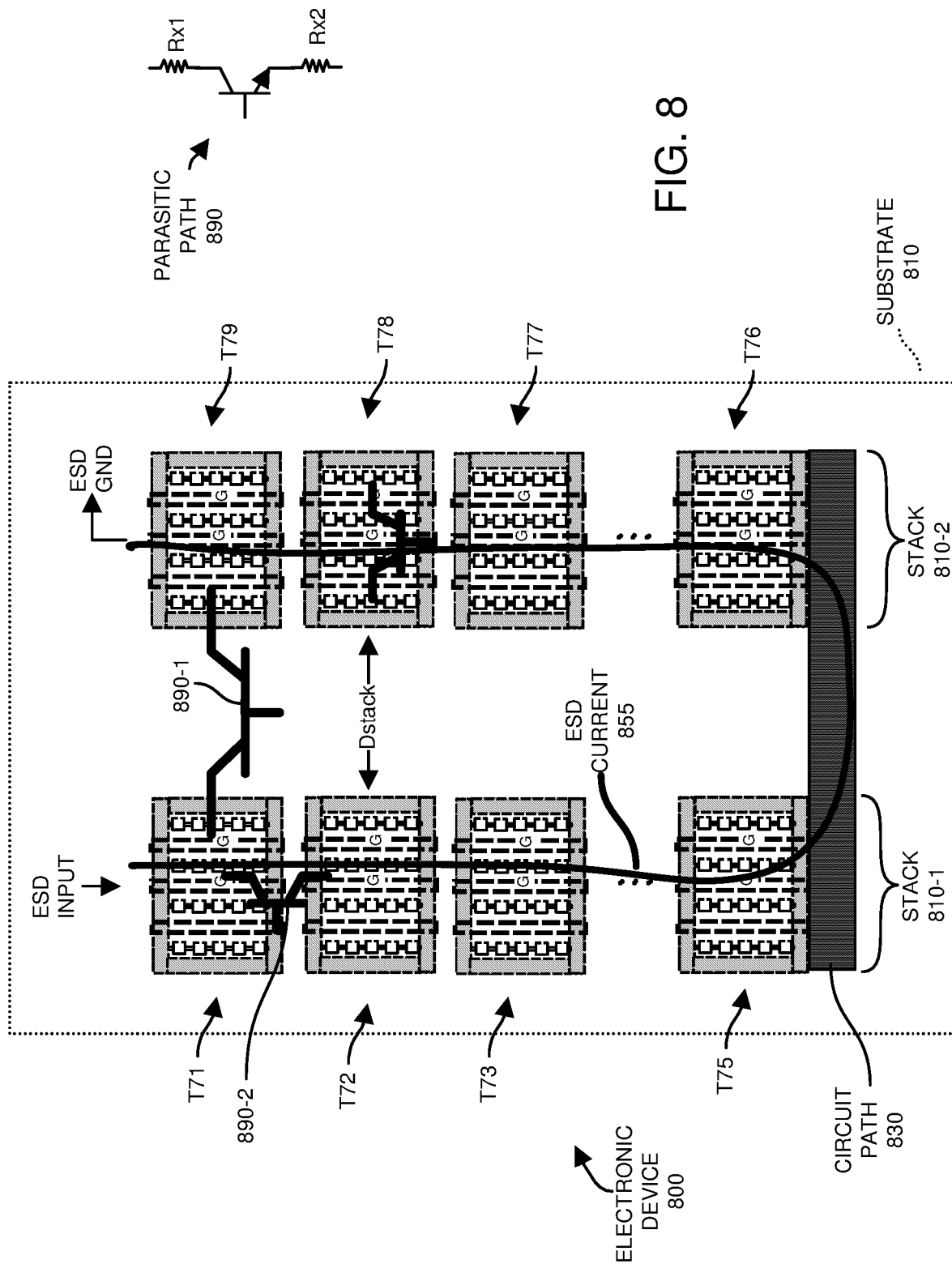
FIG. 8 is an example diagram illustrating a top view configuration of an electronic device according to embodiments herein.

FIG. 8 is an example diagram illustrating a top view configuration of an electronic device according to embodiments herein.

The concepts presented herein for ESD robust RF-MOS stacks focus at least in part on bipolar parasitics within the stack comprising the two types of intra- (within transistor) and inter-transistor (between transistors) parasitics as in detail discussed above.

In general, RF products typically consist of multiple RF-NMOS stacks (such as side by side stacks 810-1 and 810-2) for instance to enable a multiple channel device (e.g. 4 channel SP4T with 4 RF switch transistors) or due to the (ESD) shunt stacks required at the RF pads. Here, as previously discussed, an analog issue as within the stacks 810 occurs between adjacent stacks regarding poor electrical isolation under ESD stress conditions involving for instance a parasitic transistor path 890-1 between the two stacks 810-1 and 810-2.

Also shown is the ESD current path 855 thru two stacks 810-1 and 810-2 in series. In one embodiment, the high voltage built-up across both stacks Vesd,s1+Vesd,s2 can reach levels beyond 100 Volts depending on the stack height, i.e. number of series transistors. This high total ESD voltage drop across the stacks can significantly increase the risk of parasitic NPN triggering between the stacks leading to an early degradation. To counteract this, the distance between the stacks Dstack can be sufficiently large to prevent parasitic turn-on with the premature ESD degradation.

In one embodiment, to harden the fringe parasitic transistor between the stacks 810, side terminations with silicide block and extension Fx (edge region Fx, see FIG. 7) can be introduced in every RF-NMOS transistor (shown on either side of the transistors here in addition to the inter-transistor ballasting Ex). This inert-stack bipolar ballasting in collector and emitter, respectively, can make the sensitive bipolar transistor (such as network NPN or PNP transistor) between the edges of the transistor more robust, thus allowing also for smaller stack spacing distances Dstack and a more compact product floorplan.

More specifically, further embodiments herein include fabricating, via fabricator resource 140, an electronic device (apparatus, hardware, semiconductor chip, integrated circuit, etc.) to include any number of transistor circuits such as transistor circuit T71, transistor circuit T72, transistor circuit T73, . . . , transistor circuit T75, transistor circuit T76, . . . , transistor circuit T77, transistor circuit T78, and transistor circuit T79 on substrate 810.

The fabricator resource 140 connects the transistor circuits in series. For example, in the transistor circuit stack 810-1, transistor circuit T71 is connected to transistor circuit T72, transistor circuit T72 is connected to transistor circuit T73, transistor circuit T73 is connected to transistor circuit T74, etc. Transistor circuit T75 is connected to transistor circuit T76 via circuit path 830.

In a similar manner as previously discussed, further embodiments herein include fabricating each of the multiple transistor circuits from multiple transistors connected in parallel.

In a manner as previously discussed with respect to FIG. 7, each of the transistor circuits in FIG. 8 includes application of silicide blocking on a periphery region of a transistor circuit. A respective internal region of each transistor circuit is covered with silicide material 121 as previously discussed in FIG. 7. Referring again to FIG. 8, absence of the silicide material 121 over the periphery regions provides increased resistance of a parasitic path formed via a combination of the series connected transistor circuits.

In one embodiment, the electronic device 800 includes a parasitic transistor path 890-2 (such as a bipolar junction transistor path) extending from transistor circuit T71 to the transistor circuit T72. The parasitic transistor path 890-2 supports flow of current during exposure of the electronic device 800 (apparatus) to an ESD (Electro-Static Discharge) condition.

Each of the transistor circuits T71, T72, T73, . . . T75 are part of a sequence or stack 810-1 of multiple transistor circuits connected in series; each of the transistor circuits T76, . . . , T77, T78, and T79 are part of a sequence or stack 810-2 of multiple transistor circuits connected in series. If desired, in a manner as previously discussed with respect to FIG. 6, a respective spacing between at least two pairs of successive transistor circuits in the sequence can be varied to provide additional protection against electro-static discharge.

Referring again to FIG. 8, in accordance with still further embodiments, the fabricator resource 140 fabricates transistor circuit T79 on the substrate 810. The transistor circuit T72 resides in a series path between the transistor circuit T71 and the transistor circuit T79. Absence of the silicide material on the periphery region (such as on the right side or edge) of the transistor circuit T71 provides increased resistance of the parasitic transistor path 890-1 formed via the combination of the transistor circuit T71 and the transistor circuit T79. More specifically, as further shown, the fabricator resource 140 fabricates silicide free regions 122 on a periphery region (such as left side or edge) of the transistor circuit T79. In a manner as previously discussed, absence of the silicide material 121 over the periphery region of the transistor circuit T79 provides increased resistance of the parasitic transistor path 890-1 formed via the side by side combination of the transistor circuit T71 and the transistor circuit T79.

In accordance with another example embodiment, a silicide free region 122 is disposed on each of the periphery regions of the transistor circuits T71, T72, etc., to encompass a respective interior region of the transistor circuit over which the silicide material 121 is disposed.

In accordance with further example embodiments, as previously discussed, the fabricator resource 140 fabricates the transistor circuit T72 to be adjacent to a first side (bottom side) of the transistor circuit T71. The fabricator resource 140 fabricates transistor circuit T79 adjacent to a second side (right side) of the transistor circuit T71. A silicide free region 122 is disposed on a periphery region of the transistor circuit T79 as previously discussed. Absence of the silicide material T79 over the periphery region of the transistor circuit T79 provides increased resistance of the parasitic transistor path 890-1 formed between a combination of the transistor circuit T71 and the transistor circuit T79.

In one nonlimiting example embodiment, the fabricator resource 140 implements silicide blocking in such a manner that the silicide free regions 122 on the periphery region of the transistor circuit T71 encompasses (such as fully or partially) an interior region of the transistor circuit T71 over which the silicide material 121 is disposed; the fabricator resource 140 implements the silicide blocking in such a manner that the silicide free regions 122 on the periphery region of the transistor circuit T72 encompasses (such as fully or partially) an interior region of the transistor circuit T72 over which the silicide material 121 is disposed; the fabricator resource 140 implements the silicide blocking in such a manner that the silicide free regions 122 on the periphery region of the transistor circuit T73 encompasses (such as fully or partially) an interior region of the transistor circuit T73 over which the silicide material 121 is disposed; . . . ; the fabricator resource 140 implements silicide blocking in such a manner that the silicide free regions 122 on the periphery region of the transistor circuit T79 encompasses (such as fully or partially) an interior region of the transistor circuit T79 over which the silicide material 121 is disposed.

As previously discussed, absence of silicide material 121 in edge or periphery regions of the transistor circuits helps to increase resistance (Rx1 and Rx2) of parasitic paths between adjacent transistor circuits in side by side stacks and transistor circuits within the same stack.

Figure 9:
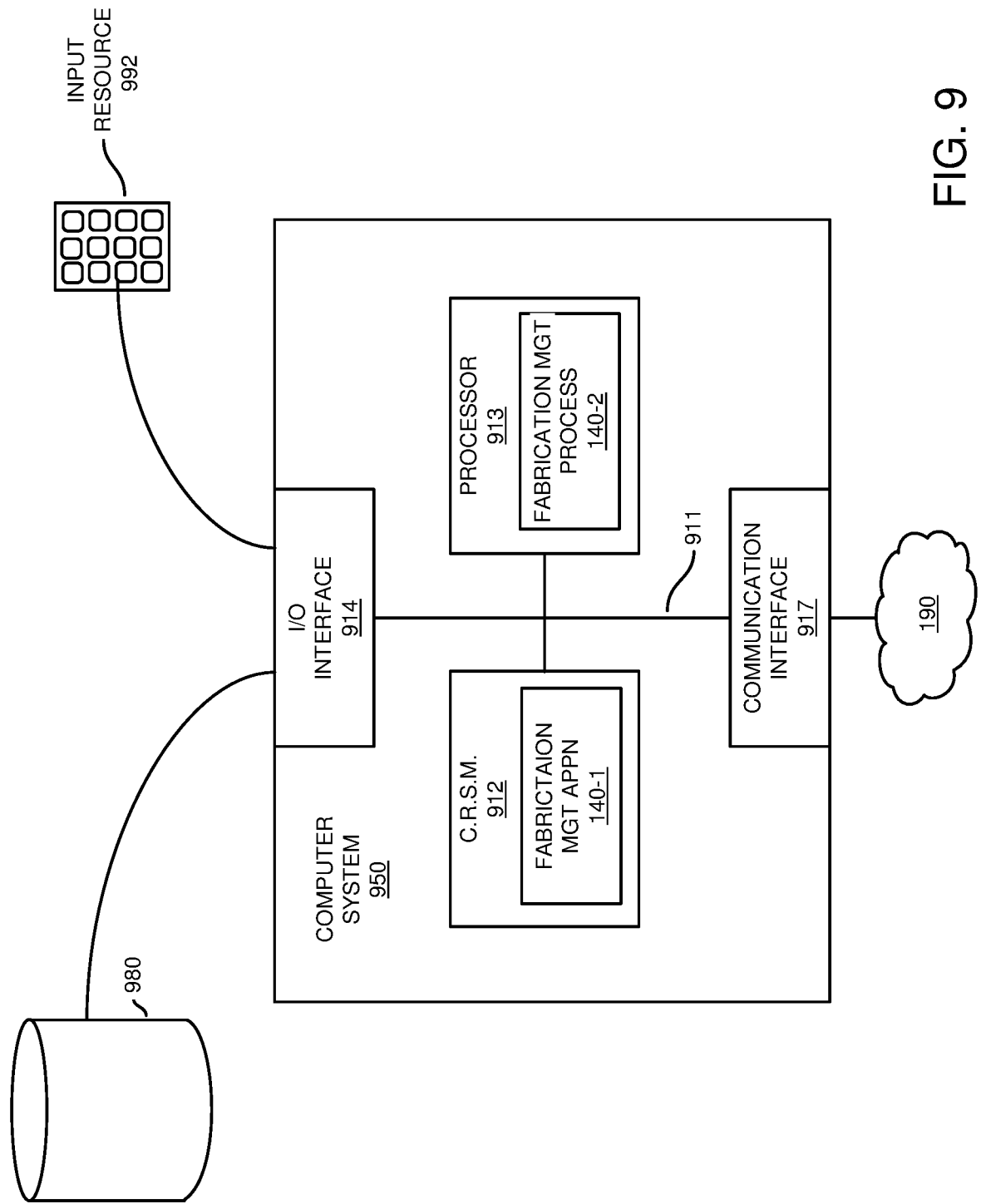
FIG. 9 is an example diagram illustrating a computer architecture to execute a fabrication process according to embodiments herein.

FIG. 9 is a diagram illustrating an example computer architecture in which to execute any of the functionality according to embodiments herein. Any of the different processing techniques as described herein can be implemented via execution of software code on computer processor hardware.

As shown, computer system 950 (e.g., computer processor hardware) of the present example can include an interconnect 911 that couples computer readable storage media 912 such as a non-transitory type of media (i.e., any type of hardware storage medium) in which digital information can be stored and retrieved. The computer system 950 can further include processor 913 (i.e., computer processor hardware such as one or more processor co-located or disparately located processor devices), I/O interface 914, communications interface 917, etc.

Note again that the computer system 950 can be located at any suitable locations in fabrication environment to carry out the operations as discussed herein. For example, computer processor hardware (i.e., processor 913 and/or computer system 950) and fabrication management application 140-1 can be located in a single location or can be distributed amongst multiple locations. Fabrication application 140-1 can be configured to execute the operations as discussed with respect to any of the wireless access points.

As its name suggests, I/O interface 914 provides connectivity to resources such as repository 980, input resource 992, one or more display screens, etc.

Computer readable storage medium 912 can be any hardware storage device to store data such as memory, optical storage, hard drive, floppy disk, etc. In one embodiment, the computer readable storage medium 912 stores instructions and/or data associated with fabrication management application 140-1.

Communications interface 917 enables the computer system 950 and processor resource 913 to communicate over a resource such as any of networks 990. I/O interface 914 enables processor resource 913 to access data from a local or remote location, control a respective display screen, receive input, etc.

As shown, computer readable storage media 912 can be encoded with fabrication management application 140-1 (e.g., software, firmware, etc.) executed by processor 913. Fabrication management application 140-1 can be configured to include instructions to implement any of the operations as discussed herein associated with fabrication resource 140.

During operation of one embodiment, processor 913 accesses computer readable storage media 912 via the use of interconnect 911 in order to launch, run, execute, interpret or otherwise perform the instructions in fabrication management application 140-1 stored on computer readable storage medium 912.

Execution of the fabrication management application 140-1 produces processing functionality such as fabrication management process 140-2 in processor resource 913. In other words, the fabrication management process 140-2 associated with processor resource 913 represents one or more aspects of executing fabrication management application 140-1 within or upon the processor resource 913 in the computer system 950.

Those skilled in the art will understand that the computer system 950 can include other processes and/or software and hardware components, such as an operating system that controls allocation and use of hardware resources to execute fabrication management application 140-2.

In accordance with different embodiments, note that computer system may be any of various types of devices, including, but not limited to, a mobile computer, a personal computer system, semiconductor fabrication equipment, base station, phone device, desktop computer, laptop, notebook, netbook computer, mainframe computer system, handheld computer, workstation, network computer, application server, storage device, a consumer electronics device such as a camera, camcorder, set top box, mobile device, video game console, handheld video game device, a peripheral device such as a switch, modem, router, etc., or in general any type of computing or electronic device.

As previously discussed, the computer system 950 may reside at any location or multiple locations. The computer system 950 can be included in any suitable resource in network environment to implement any of the functionality as discussed herein.

Functionality supported by the different resources will now be discussed via flowchart in FIGS. 10 and 11. Note that the steps in the flowcharts below can be executed in any suitable order.

Figure 10:
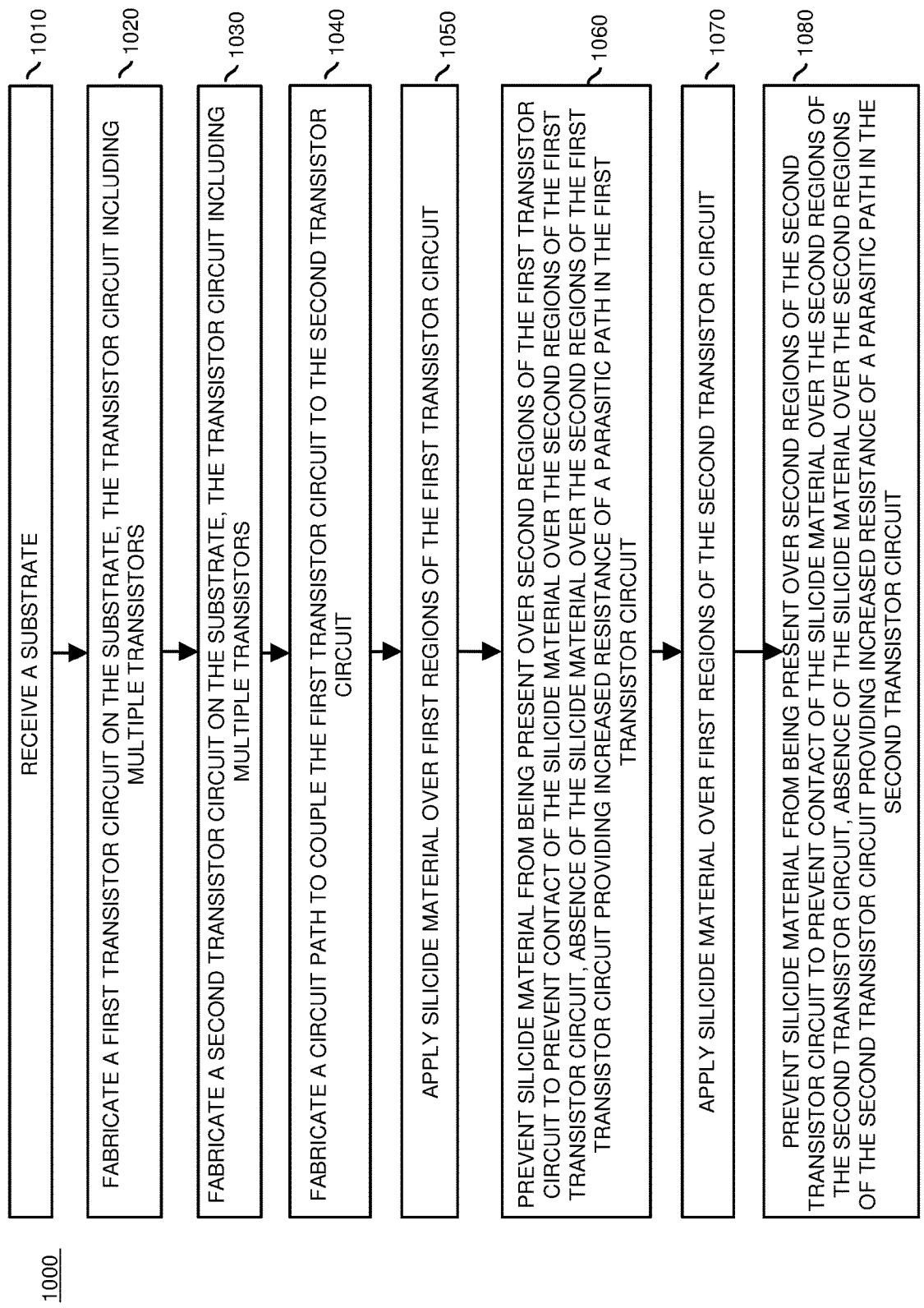
FIG. 10 is an example diagram illustrating a method of fabricating an electronic device according to embodiments herein.

FIG. 10 is a flowchart 1000 illustrating an example method according to embodiments herein. Note that there will be some overlap with respect to concepts as discussed above.

In processing operation 1010, the fabricator resource 140 receives a substrate 110.

In processing operation 1020, the fabricator resource 140 fabricates a first transistor circuit on the substrate 110, the first transistor circuit including multiple transistors.

In processing operation 1030, the fabricator resource 140 fabricates a second transistor circuit on the substrate 110, the second transistor circuit including multiple transistors.

In processing operation 1040, the fabricator resource 140 fabricates a circuit path to couple the first transistor circuit to the second transistor circuit in series.

In processing operation 1050, the fabricator resource 140 applies silicide material 121 over first regions of the first transistor circuit.

In processing operation 1060, the fabricator resource 140 implements silicide blocking over second regions of the first transistor circuit to prevent presence of the silicide material 121 over the second regions (silicide free regions) of the first transistor circuit. Absence of the silicide material 121 over the second regions of the first transistor circuit provides increased resistance of a parasitic path in the first transistor circuit.

In processing operation 1070, the fabricator resource 140 applies silicide material 121 over first regions of the second transistor circuit.

In processing operation 1080, the fabricator resource 140 implements silicide blocking over second regions of the second transistor circuit to prevent presence of the silicide material 121 over the second regions of the second transistor circuit. Absence of the silicide material 121 over the second regions of the second transistor circuit provides increased resistance of a parasitic path in the second transistor circuit.

Figure 11:
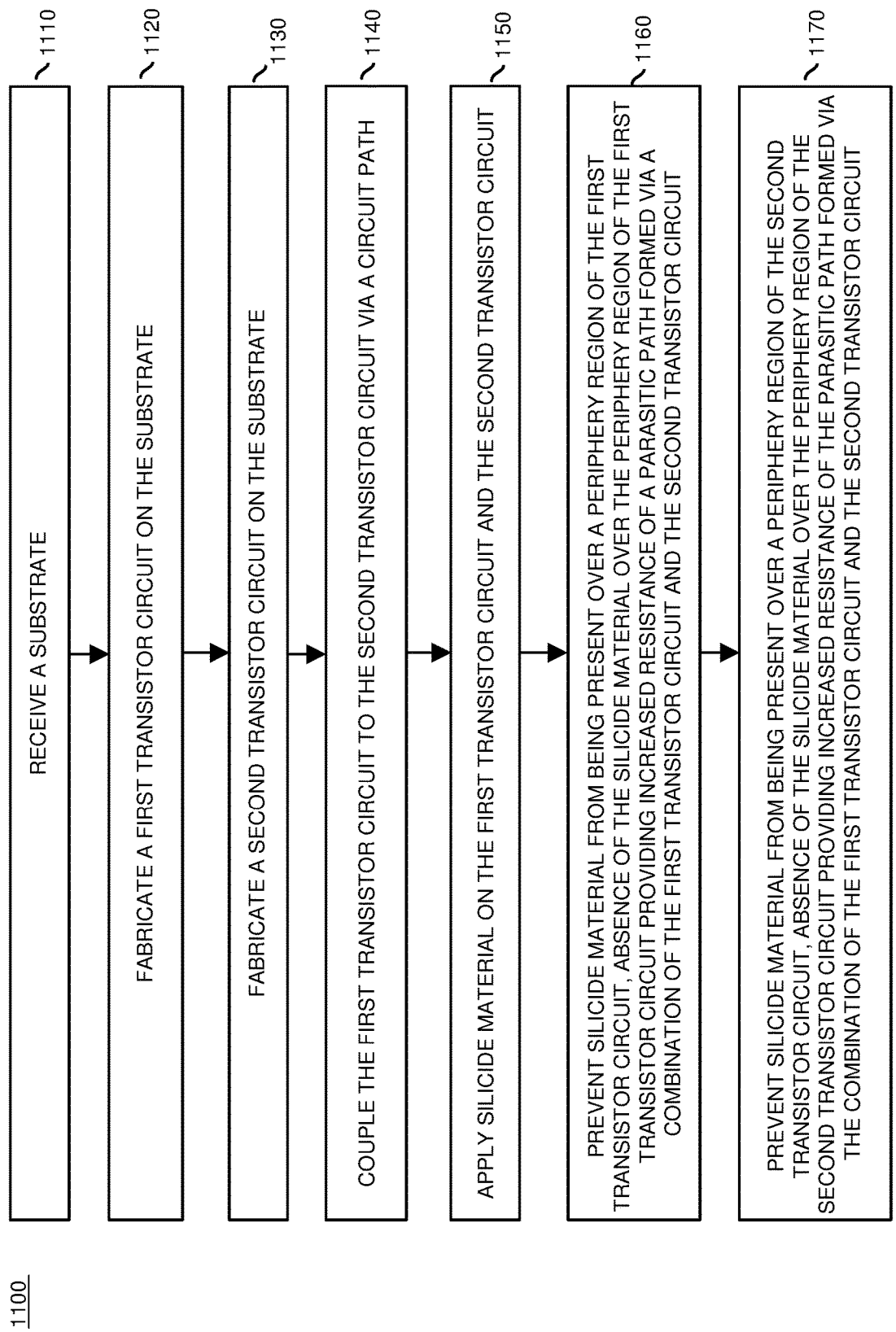
FIG. 11 is an example diagram illustrating a method of fabricating an electronic device according to embodiments herein.

FIG. 11 is a flowchart 1100 illustrating an example method according to embodiments herein. Note that there will be some overlap with respect to concepts as discussed above.

In processing operation 1110, the fabricator resource 140 receives a substrate 810.

In processing operation 1120, the fabricator resource 140 fabricates a first transistor circuit on the substrate 810.

In processing operation 1130, the fabricator resource 140 fabricates a second transistor circuit on the substrate 810.

In processing operation 1140, the fabricator resource 140 applies silicide material 121 on at least portions of the first transistor circuit and the second transistor circuit.

In processing operation 1150, the fabricator resource 140 implements silicide blocking on a periphery region of the first transistor circuit. Absence of the silicide material over the periphery region of the first transistor circuit provides increased resistance of a parasitic path formed via a combination of the first transistor circuit and the second transistor circuit.

In processing operation 1160, the fabricator resource 140 implements silicide blocking on a periphery region of the second transistor circuit. Absence of the silicide material 122 over the periphery region of the second transistor circuit provides increased resistance of the parasitic path formed via the combination of the first transistor circuit and the second transistor circuit.

As previously discussed, the fabricator resource 140 can be configured to produce silicide free regions on any side of each of the transistor circuits to increase a resistance of parasitic paths on any of one or more sides of a transistor circuit and respective one or more transistor circuits.

Note again that techniques herein are well suited for use in fabrication of transistor circuits susceptible to ESD damage. However, it should be noted that embodiments herein are not limited to use in such applications and that the techniques discussed herein are well suited for other applications as well.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

We claim:

1. An apparatus comprising:
   a high-ohmic substrate;
   a first transistor circuit fabricated on the high-ohmic substrate;
   a second transistor circuit fabricated on the high-ohmic substrate;
   silicide material disposed on first regions of the first transistor circuit;
   the silicide material being absent from second regions of the first transistor circuit;
   the silicide material being absent from a third region of the apparatus between the first transistor circuit and the second transistor circuit;
   wherein the absence of the silicide material from the region provides increased resistance of a parasitic path between the first transistor circuit and the second transistor circuit; and
   wherein the parasitic path is a parasitic transistor path extending from the first transistor circuit to the second transistor circuit.

2. The apparatus as in claim 1, wherein the second regions reside between drain regions and source regions of the first transistor circuit.

3. The apparatus as in claim 2, wherein the first transistor circuit includes multiple transistors connected in parallel, the multiple transistors disposed on the high-ohmic substrate and being non-isolated transistors.

4. The apparatus as in claim 3, wherein the parasitic path is first parasitic path; and
   wherein absence of the silicide material over the second regions provides increased resistance of a second parasitic path in the first transistor circuit and wherein the second parasitic path in the first transistor circuit supports flow of current during exposure of the first transistor circuit to an ESD (Electro-Static Discharge) condition.

5. The apparatus as in claim 4, wherein the second parasitic path in the first transistor circuity is a parasitic bipolar junction transistor.

6. The apparatus as in claim 4, wherein the second parasitic path in the first transistor circuit extends between drain regions and source regions of the multiple transistors.

7. The apparatus as in claim 3, wherein the silicide material is disposed over: i) drain regions of the multiple transistors in the first transistor circuit, and ii) source regions of the multiple transistors in the first transistor circuit;
   wherein the silicide material is absent over a first strip of the first transistor circuit between the drain regions and the gate regions; and
   wherein the silicide material is absent over a second strip of the first transistor circuit between the source regions and the gate regions.

8. The apparatus as in claim 1, wherein
   the silicide material is absent over a perimeter region of the first transistor circuit between the first transistor circuit and the second transistor circuit, the second transistor circuit being adjacent to the first transistor circuit.

9. The apparatus as in claim 1, wherein the high-ohmic substrate has a resistance of more than 100 ohms×centimeter.

10. The apparatus as in claim 1, wherein the first transistor circuit includes multiple transistors connected in parallel; and
    wherein the multiple transistors of the first transistor circuit are controlled by a common gate.

11. The apparatus as in claim 10, wherein the silicide material is absent from residing over the common gate.

12. The apparatus as in claim 1, wherein the second regions include: i) a first strip of area disposed over a drain region of the first transistor circuit, the silicide material being absent from the first strip of area, and ii) a second strip of area disposed over a source region of the first transistor circuit, the silicide material being absent from the second strip of area.

13. The apparatus as in claim 12, wherein the first strip of area is disposed between a gate node of the first transistor circuit and a sequence of multiple drain nodes of the first transistor circuit; and
    wherein the second strip of area is disposed between the gate node of the first transistor circuit and a sequence of multiple source nodes of the first transistor circuit.

14. The apparatus as in claim 13, wherein a width of the first strip of area is operative to control a resistance of a first parasitic path of the first transistor circuit; and
    wherein a width of the second strip of area is operative to control a resistance of a second parasitic path of the first transistor circuit.

15. The apparatus as in claim 1, wherein parasitic resistive paths of the first transistor circuit are controlled via dimensions of the second regions.

16. The apparatus as in claim 1, wherein the first regions include: i) a first silicide region disposed over a drain region of the first transistor circuit including a sequence of drain nodes, the silicide material being present in the first silicide region, and ii) a second silicide region disposed over a source region of the first transistor circuit including a sequence of source nodes, the silicide material being present in the second silicide region.

17. The apparatus as in claim 16, wherein the second regions include: i) a first silicide-free region disposed over the drain region of the first transistor circuit, the silicide material being absent over the first silicide-free region, and ii) a second silicide-free region disposed over the source region of the first transistor circuit, the silicide material being absent over the second silicide-free region.

18. An apparatus comprising:
    a high-ohmic substrate;
    a first transistor circuit fabricated on the high-ohmic substrate:
    a second transistor circuit fabricated on the high-ohmic substrate;
    silicide material disposed on first regions of the first transistor circuit;
    the silicide material being absent from second regions of the first transistor circuit;
    the silicide material being absent from a third region of the apparatus between the first transistor circuit and the second transistor circuit;

wherein the first transistor circuit includes first transistors, the apparatus further comprising:

the second transistor circuit comprising:
second transistors;
silicide material disposed on first regions of second, transistor circuit; and
the silicide material being absent over second regions of the second transistor circuit, absence of the silicide material over the second regions of the second transistor circuit providing increased resistance of a parasitic path in the second transistor circuit;
a circuit path extending between the first transistor circuit and the second transistor circuit, the circuit path connecting the first transistor circuit and the second transistor circuit in series; and
the silicide material being absent over a periphery region of the first transistor circuit, the perimeter region disposed adjacent to the second transistor circuit.

19. An apparatus comprising:
a first transistor circuit fabricated on a substrate;
a second transistor circuit fabricated on the substrate, the first transistor circuit electrically connected to the second transistor circuit;
silicide material disposed on the first transistor circuit and the second transistor circuit; and
the silicide material being absent over a periphery region of the first transistor circuit; and
wherein absence of the silicide material over the periphery region of the first transistor provides increased resistance of a parasitic path formed via a combination of the first transistor circuit and the second transistor circuit and wherein the parasitic path is a parasitic transistor path extending from the first transistor circuit to the second transistor circuit.

20. The apparatus as in claim 19, wherein the first transistor circuit and the second transistor circuit are part of a sequence of multiple transistor circuits connected in series; and
wherein a respective spacing between at least two pairs of successive transistor circuits in the sequence is varied to protect the apparatus from electro-static discharge.

21. An apparatus comprising:
a first transistor circuit fabricated on a substrate;
a second transistor circuit fabricated on the substrate, the first transistor circuit electrically connected to the second transistor circuit;
silicide material disposed on the first transistor circuit and the second transistor circuit;
the silicide material being absent over a periphery region of the first transistor circuit; and wherein the silicide material is disposed on the second transistor circuit;
the silicide material absent over a periphery region of the second transistor circuit, absence of the silicide material over the periphery region of the second transistor circuit providing increased resistance of a parasitic path formed via the combination of the first transistor circuit and the second transistor circuit.

22. An apparatus comprising:
a first transistor circuit fabricated on a substrate;
a second transistor circuit fabricated on the substrate, the first transistor circuit electrically connected to the second transistor circuit;
silicide material disposed on the first transistor circuit and the second transistor circuit; and
the silicide material being absent over a periphery region of the first transistor circuit,
a third transistor circuit disposed on the substrate;
wherein the second transistor circuit resides in a series path between the first transistor circuit and the third transistor circuit; and
wherein absence of the silicide material over the periphery region of the first transistor circuit provides increased resistance of the parasitic path formed via the combination of the first transistor circuit and the third transistor circuit.

23. The apparatus as in claim 22, wherein the silicide material resides over an interior surface region of the first transistor circuit.

24. An apparatus comprising:
a first transistor circuit fabricated on a substrate;
a second transistor circuit fabricated on the substrate, the first transistor circuit electrically connected to the second transistor circuit;
silicide material disposed on the first transistor circuit and the second transistor circuit;
the silicide material absent over a periphery region of the first transistor circuit;
wherein the second transistor circuit is disposed adjacent to a first side of the first transistor circuit, the apparatus further comprising:
a third transistor circuit fabricated on the substrate, the third transistor circuit disposed adjacent to a second side of the first transistor circuit; and
the silicide material absent over a periphery region of the third transistor circuit, absence of the silicide material over the periphery region of the third transistor circuit providing increased resistance of the parasitic path formed between a combination of the first transistor circuit and the third transistor circuit.

* * * * *

UNITED STATES PATENT AND TRADEMARK OFFICE
CERTIFICATE OF CORRECTION

| | |
|---|---|
| PATENT NO. | : 11,430,749 B2 |
| APPLICATION NO. | : 16/662425 |
| DATED | : August 30, 2022 |
| INVENTOR(S) | : Markus Mergens and Werner Simbuerger |

It is certified that error appears in the above-identified patent and that said Letters Patent is hereby corrected as shown below:

In the Claims

Column 21, Line 30, Claim 1, before "region", add --third--

Column 21, Line 56, Claim 5, replace "circuity", with --circuitry--

Column 22, Line 58, Claim 18, replace "substrate:", with --substrate;--

Column 23, Line 5, Claim 18, replace "of second", with --of the second--

Column 24, Line 17, Claim 22, replace "circuit,", with --circuit;--

Signed and Sealed this
Ninth Day of April, 2024

Katherine Kelly Vidal
*Director of the United States Patent and Trademark Office*